(12) United States Patent
Hayashi et al.

(10) Patent No.: US 11,142,653 B2
(45) Date of Patent: Oct. 12, 2021

(54) METHOD FOR PRODUCING ANTIFOULING FILM

(71) Applicants: Sharp Kabushiki Kaisha, Sakai (JP); DAIKIN INDUSTRIES, LTD., Osaka (JP)

(72) Inventors: Hidekazu Hayashi, Sakai (JP); Tokio Taguchi, Sakai (JP); Kenichiro Nakamatsu, Sakai (JP); Yasuhiro Shibai, Sakai (JP); Ken Atsumo, Sakai (JP); Tsuneo Yamashita, Osaka (JP); Saya Nii, Osaka (JP); Eiji Sakamoto, Osaka (JP); Kakeru Hanabusa, Osaka (JP); Hisashi Mitsuhashi, Osaka (JP); Takayuki Araki, Osaka (JP)

(73) Assignees: SHARP KABUSHIKI KAISHA, Sakai (JP); DAIKIN INDUSTRIES, LTD., Osaka (JP)

( * ) Notice: Subject to any disclaimer, the term of this patent is extended or adjusted under 35 U.S.C. 154(b) by 302 days.

(21) Appl. No.: 16/317,161

(22) PCT Filed: Jul. 3, 2017

(86) PCT No.: PCT/JP2017/024381
§ 371 (c)(1),
(2) Date: Jan. 11, 2019

(87) PCT Pub. No.: WO2018/012344
PCT Pub. Date: Jan. 18, 2018

(65) Prior Publication Data
US 2019/0233656 A1 Aug. 1, 2019

(30) Foreign Application Priority Data
Jul. 12, 2016 (JP) .............................. JP2016-137936

(51) Int. Cl.
*C09D 5/00* (2006.01)
*G02B 1/18* (2015.01)
(Continued)

(52) U.S. Cl.
CPC ............ *C09D 5/00* (2013.01); *B29C 37/0067* (2013.01); *B29C 59/026* (2013.01);
(Continued)

(58) Field of Classification Search
CPC ........ C09D 5/00; C09D 175/14; B32B 27/18; B32B 27/30; B32B 38/06; B32B 27/16;
(Continued)

(56) References Cited

U.S. PATENT DOCUMENTS 5,922,787 A 7/1999 Kondo et al.
8,211,544 B2 * 7/2012 Itami .................... C09D 183/12
428/429

(Continued)

FOREIGN PATENT DOCUMENTS

JP   2003-172808 A   6/2003
JP   2005-097371 A   4/2005
(Continued)

OTHER PUBLICATIONS

Official Communication issued in International Patent Application No. PCT/JP2017/024381, dated Sep. 19, 2017.

*Primary Examiner* — Mathieu D Vargot
(74) *Attorney, Agent, or Firm* — Keating & Bennett, LLP

(57) ABSTRACT

The present invention provides a method for producing an antifouling film having excellent antifouling properties and rubbing resistance. The method for producing an antifouling film of the present invention includes Process (1) of applying a resin to a surface of a substrate; Process (2) of pushing the substrate to a die with the resin in between to form an uneven structure on a surface of the resin; and Process (3) of
(Continued)

curing the resin including the uneven structure on the surface thereof to form a polymer layer. The resin contains an antifouling agent that contains a compound containing a perfluoro(poly)ether group. The die includes a surface having undergone release treatment using a release agent containing a compound that contains a perfluoro(poly)ether group, a hydrolyzable group, and a Si atom.

10 Claims, 2 Drawing Sheets

(51) Int. Cl.
| | |
|---|---|
| C08G 18/67 | (2006.01) |
| B32B 27/16 | (2006.01) |
| C08G 18/79 | (2006.01) |
| B32B 27/18 | (2006.01) |
| B32B 27/30 | (2006.01) |
| B32B 38/06 | (2006.01) |
| B29C 59/02 | (2006.01) |
| B29C 59/04 | (2006.01) |
| B29C 37/00 | (2006.01) |
| C08G 18/48 | (2006.01) |
| C08G 18/72 | (2006.01) |
| C09D 175/14 | (2006.01) |
| G03F 7/00 | (2006.01) |
| B29C 35/08 | (2006.01) |

(52) U.S. Cl.
CPC ............ *B29C 59/046* (2013.01); *B32B 27/16* (2013.01); *B32B 27/18* (2013.01); *B32B 27/30* (2013.01); *B32B 38/06* (2013.01); *C08G 18/48* (2013.01); *C08G 18/67* (2013.01); *C08G 18/6755* (2013.01); *C08G 18/72* (2013.01); *C08G 18/79* (2013.01); *C09D 175/14* (2013.01); *G02B 1/18* (2015.01); *G03F 7/0002* (2013.01); *B29C 2035/0827* (2013.01); *B29C 2059/023* (2013.01)

(58) Field of Classification Search
CPC .......... B32B 3/30; B32B 5/14; B29C 59/026; B29C 59/046; B29C 37/0067; G02B 1/18; C08G 18/242; C08G 18/5015; C08G 18/672; C08G 18/73; C08G 18/67; C08G 18/79; C08G 18/48; C08G 18/6755; C08G 18/72; C08J 5/18
See application file for complete search history.

(56) References Cited

U.S. PATENT DOCUMENTS

| | | |
|---|---|---|
| 2012/0100369 A1 | 4/2012 | Hanazawa et al. |
| 2013/0011572 A1 | 1/2013 | Nakai et al. |
| 2013/0140744 A1 | 6/2013 | Nakai et al. |
| 2016/0237199 A1 | 8/2016 | Yoshida et al. |
| 2016/0289488 A1 | 10/2016 | Yoshida et al. |
| 2017/0218151 A1 | 8/2017 | Hanazawa et al. |

FOREIGN PATENT DOCUMENTS

| | | | |
|---|---|---|---|
| JP | 2007-178724 A | | 7/2007 |
| JP | 5005114 B2 | | 8/2012 |
| JP | 2014-153524 A | | 8/2014 |
| JP | 2014-200973 A | | 10/2014 |
| JP | 2014-236172 A | | 12/2014 |
| TW | 201430068 A | | 8/2014 |
| WO | WO 03/002628 | * | 1/2003 |
| WO | 2010/131652 A1 | | 11/2010 |
| WO | 2011/155480 A1 | | 12/2011 |
| WO | 2015/056744 A1 | | 4/2015 |

\* cited by examiner (a)

(b)

(c)

(d)

METHOD FOR PRODUCING ANTIFOULING FILM

TECHNICAL FIELD

The present invention relates to methods for producing antifouling films. The present invention more specifically relates to a method for producing a film that includes an uneven structure of nanometer scale and has antifouling properties.

BACKGROUND ART

Films including an uneven structure of nanometer scale (nanostructure) are known for their use as antireflection films (for example, see Patent Literatures 1 to 5). This uneven structure has a continuously varying refractive index from the air layer to the substrate, thereby capable of reducing the reflected light significantly.

CITATION LIST

Patent Literature

Patent Literature 1: JP 2003-172808 A
Patent Literature 2: JP 2007-178724 A
Patent Literature 3: JP 5005114 B
Patent Literature 4: JP 2014-153524 A
Patent Literature 5: JP 2005-97371 A

SUMMARY OF INVENTION

Technical Problem

Examples of such antireflection films include structures in which a polymer layer including an uneven structure on a surface thereof is disposed on a surface of a substrate. Still, conventional antireflection films unfortunately have poor antifouling properties. Uneven structures allow dirt to easily accumulate between projections. Such dirt is difficult to wipe off with dry cloth, and thus a dedicated liquid cleaner is used to float the dirt and then the dirt is wiped off, for example. The hydrophilicity of antireflection films is therefore increased in some cases in consideration of the compatibility with a liquid cleaner. In such cases, the antifouling properties are difficult to improve.

In response to the above issue, the present inventors examined application of antifouling functions to antireflection films having an uneven structure on a surface thereof. In the course of the examination, they found that the surface of an uneven structure of nanometer scale formed from a water-repellent and oil-repellent material can exhibit, owing to the effect of the surface shape, significantly superior water repellency and oil repellency to the water repellency and the oil repellency of the material itself. The inventors then examined the following three methods so as to achieve a functional film (antifouling film) including an uneven structure of nanometer scale on a surface thereof and exhibiting significant water repellency and oil repellency, i.e., significant antifouling properties.

In a first method, an antifouling film was formed on the surface (the surface opposite to the substrate) of the polymer layer. However, the inventors found that the adhesion between the polymer layer and the antifouling film was insufficient and the rubbing resistance was poor.

In a second method, a lubricant was infiltrated into the surface (the surface opposite to the substrate) of the polymer layer. However, the inventors found that the lubricant was wiped off when dirt sticking to the polymer layer was wiped off, so that the lubricant needed to be supplied at regular intervals so as to prevent reduction of (to maintain) the antifouling properties.

In a third method, an antifouling agent was added to a resin constituting the polymer layer and bled out. However, the inventors found that the degree of bleed out was insufficient and the resulting antifouling properties were insufficient.

As mentioned above, conventional methods for producing antifouling films need to be improved in order to achieve an antifouling film having excellent antifouling properties and rubbing resistance.

Patent Literature 1 discloses a structure in which a water-repellent film of polytetrafluoroethylene is formed on a surface of an uneven structure. However, the water-repellent film poorly adheres to the uneven structure and is therefore likely to be released. Further, the water-repellent film is thin and has low film strength, so that the concentration of polytetrafluoroethylene is likely to decrease in wiping off. Accordingly, the structure needs to be improved in order to achieve better rubbing resistance.

Patent Literature 2 discloses a method of forming an uneven structure including providing and pressing a photo-curable resin composition containing a fluorine compound between a substrate and a die, and curing the resin composition. However, the fluorine compound used is a perfluoroalkyl compound and the concentration of the fluorine compound is insufficient on the surface of the uneven structure. Accordingly, the method needs to be improved in order to achieve better antifouling properties.

Patent Literature 3 discloses a method of forming an uneven structure including treating a surface of a die with an external release agent, providing an active energy ray-curable resin composition containing an internal release agent between a substrate and the die, and curing the resin composition. However, even when the internal release agent is a hydrophobic material and bleed out thereof is utilized, hydrophobic groups are less likely to gather. Further, the hydrophobic groups are not coupled with each other and are unstable. Accordingly, the method needs to be improved in order to achieve better antifouling properties and rubbing resistance.

Patent Literature 4 discloses a structure in which a lubricating layer formed of a fluorine-based lubricant containing a perfluoroalkyl polyether carboxylate is stacked on a surface of an uneven structure. However, the lubricating layer poorly adheres to the uneven structure and is therefore likely to be released. Accordingly, the structure needs to be improved in order to achieve better rubbing resistance.

Patent Literature 5 discloses a structure in which an uneven structure is formed from a fluorine-containing resin composition containing a fluorine-containing compound. However, the fluorine-containing compound used is a perfluoroalkyl compound and the surface of the uneven structure has insufficient smoothness. Accordingly, the structure needs to be improved in order to achieve better rubbing resistance.

The present invention is devised in view of the above state of the art, and aims to provide a method for producing an antifouling film having excellent antifouling properties and rubbing resistance.

Solution to Problem

The present inventors performed various studies on a method for producing an antifouling film having excellent antifouling properties and rubbing resistance, and focused on application of the aforementioned third method. Then, they found a method in which a resin containing an antifouling agent that contains a predetermined perfluoropolyether compound as a resin constituting the polymer layer and a release agent containing a predetermined perfluoropolyether compound is used as a release agent for release treatment on a die. Finally, the present inventors have arrived at an excellent solution to the above problems, completing the present invention.

In other words, an aspect of the present invention may be a method for producing an antifouling film including a polymer layer that includes on a surface thereof an uneven structure provided with multiple projections at a pitch not longer than a wavelength of visible light, the method including: Process (1) of applying a resin to a surface of a substrate; Process (2) of pushing the substrate to a die with the resin in between to form the uneven structure on a surface of the resin; and Process (3) of curing the resin including the uneven structure on the surface thereof to form the polymer layer, the resin containing an antifouling agent that contains a compound containing a perfluoro(poly)ether group, the die including a surface having undergone release treatment using a release agent containing a compound that contains a perfluoro(poly)ether group, a hydrolyzable group, and a Si atom.

Advantageous Effects of Invention

The present invention can provide a method for producing an antifouling film having excellent antifouling properties and rubbing resistance.

BRIEF DESCRIPTION OF THE DRAWINGS

FIG. 2(a) is a graph of Example 6, FIG. 2(b) is a graph of Example 7, FIG. 2(c) is a graph of Example 8, and FIG. 2(d) is a graph of Example 9.

DESCRIPTION OF EMBODIMENTS

Hereinafter, the present invention is described in more detail based on an embodiment with reference to the drawings. The embodiment, however, is not intended to limit the scope of the present invention. The features of the embodiment may appropriately be combined or modified within the spirit of the present invention.

The antifouling film as used herein means a film that enables easy removal of dirt sticking to a surface thereof.

The expression "A to B" as used herein means "not lower than A and not greater than B".

The active hydrogen as used herein means a hydrogen atom that can be given as a proton to an isocyanate group.

The active-hydrogen-containing group as used herein means a group containing active hydrogen, and examples thereof include a —OH group, a —C(=O)H group, a —SH group, a —SO$_3$H group, a —SO$_2$H group, a —SOH group, a —NH$_2$ group, a —NH— group, and a —SiH group.

The divalent organic group as used herein means a divalent group containing carbon. The divalent organic group may be, but is not limited to, a divalent group obtained by removing another hydrogen atom from a hydrocarbon group.

The hydrocarbon group as used herein means a group containing carbon and hydrogen. Examples of the hydrocarbon group include, but are not limited to, C1-C20 hydrocarbon groups optionally substituted with one or more substituents, such as aliphatic hydrocarbon groups and aromatic hydrocarbon groups. Each aliphatic hydrocarbon group may be linear, branched, or cyclic, and may be either saturated or unsaturated. The hydrocarbon group may contain one or more cyclic structure. The hydrocarbon group may contain, at an end or in the molecular chain thereof, one or more of atoms and groups such as N, O, S, Si, amide, sulfonyl, siloxane, carbonyl, and carbonyloxy.

Examples of the substituents for the hydrocarbon group as used herein include, but are not limited to, C1-C6 alkyl groups, C2-C6 alkenyl groups, C2-C6 alkynyl groups, C3-C10 cycloalkyl groups, C3-C10 unsaturated cycloalkyl groups, 5- to 10-membered heterocyclyl groups, 5- to 10-membered unsaturated heterocyclyl groups, C6-C10 aryl groups, and 5- to 10-membered heteroaryl groups, optionally substituted with one or more halogen atoms.

The hydrolyzable group as used herein means a group that can be desorbed from the main backbone of a compound by hydrolysis. The hydrolyzable group may be an alkoxy group. Specific examples thereof include —OA, —OCOA, —O—N=C(A)$_2$, —N(A)$_2$, —NHA, and halogens, wherein A is a substituted or non-substituted C1-C3 alkyl group.

The number average molecular weight as used herein means a value determined by $^{19}$F-NMR.

EMBODIMENT

Figure 1:
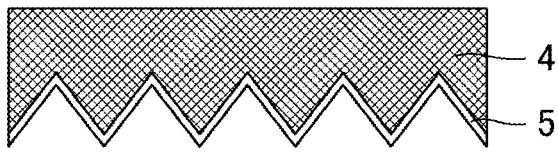
FIG. 1 includes schematic cross-sectional views illustrating a method for producing an antifouling film of an embodiment.
Figure 1:
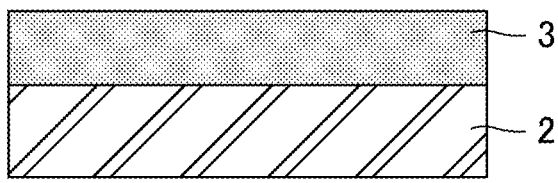
Figure 1:
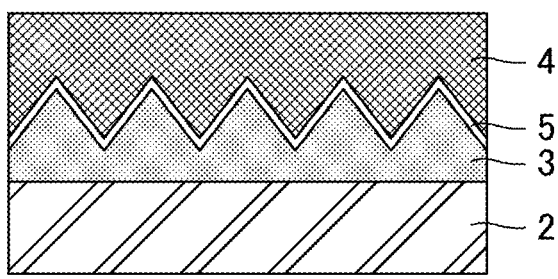
Figure 1:
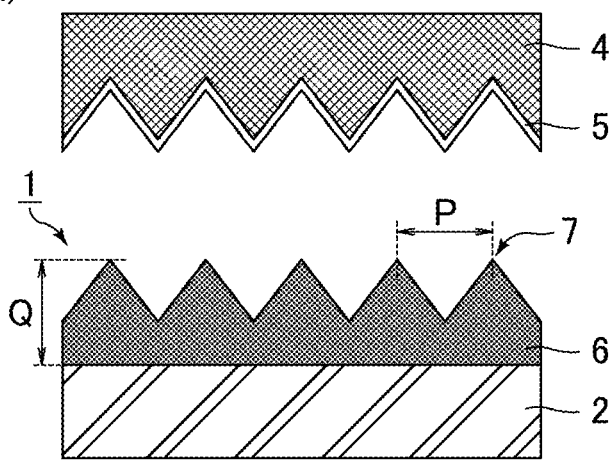

A method for producing an antifouling film of an embodiment is described below with reference to FIG. 1. FIG. 1 includes schematic cross-sectional views illustrating a method for producing an antifouling film of the embodiment.

(a) Application of Resin (Process (1))

As shown in FIG. 1(a), a resin 3 is applied to a surface of a substrate 2. Separately, a die 4 is prepared. The die 4 includes a surface having undergone release treatment using a release agent 5.

Examples of a technique of applying the resin 3 include spray coating, gravure coating, and slot-die coating. In order to easily adjust the film thickness and to reduce the device cost, gravure coating or slot-die coating is preferred.

(b) Formation of Uneven Structure (Process (2))

As shown in FIG. 1(b), the substrate 2 is pushed to the die 4 with the resin 3 in between. As a result, the uneven structure is formed on a surface (a surface opposite to the substrate 2) of the resin 3.

(c) Curing of Resin (Process (3))

As shown in FIG. 1(c), the resin 3 including the uneven structure on the surface thereof is cured, so that a polymer layer 6 is formed.

Examples of the method of curing the resin 3 include application of active energy rays and heating, and a method utilizing application of active energy rays is preferred. The active energy rays herein mean ultraviolet rays, visible light, infrared rays, plasma, or the like. The resin 3 is preferably one that is curable by ultraviolet rays. Application of active energy rays to the resin 3 may be performed from the substrate 2 side of the resin 3, or may be performed from the die 4 side of the resin 3. Application of active energy rays to the resin 3 may be performed once or may be performed multiple times. Curing of the resin 3 may be performed simultaneously with the aforementioned formation of the uneven structure on the resin 3.

(d) Release of Die

As shown in FIG. 1(*d*), the die 4 is released from the polymer layer 6. As a result, an antifouling film 1 is completed. The uneven structure formed on the surface (the surface opposite to the substrate 2) of the polymer layer 6 corresponds to a structure provided with multiple projections (protrusions) 7 at a pitch (distance between the apexes of adjacent projections 7) P not longer than the wavelength of visible light, i.e., a moth-eye structure (a structure like a moth's eye). Thus, the antifouling film 1 can exert excellent antireflective properties (low reflectivity) owing to the moth-eye structure. The antifouling film 1 may be applied to any use that utilizes the excellent antifouling properties thereof, and the use is not limited to an optical film such as an antireflection film.

In the aforementioned production process, Processes (1) to (3) can be continuously and efficiently performed if the substrate 2 is in the form of a roll.

Next, the materials used in production of the antifouling film 1 are described below.

The material of the substrate 2 may be, for example, a resin such as triacetyl cellulose (TAC), polyethylene terephthalate (PET), polymethyl methacrylate (PMMA), a cycloolefin polymer (COP), or polycarbonate (PC), and may be selected as appropriate in accordance with the use environment. These materials can provide a substrate 2 having high hardness and excellent transparency and weather resistance. One surface (the surface close to the polymer layer 6) of the substrate 2 may have undergone easy adhesion treatment. For example, a triacetyl cellulose film with easy adhesion treatment may be used. One surface (the surface close to the polymer layer 6) of the substrate 2 may have undergone saponification treatment. For example, a saponified triacetyl cellulose film may be used. The resin to be used as a material of the substrate 2 may be colored. The material of the substrate 2 is not limited to the above resins, and may be glass, metal, fiber, or paper (including printed matter such as a photograph), for example.

In order to ensure the transparency and processability, the substrate 2 preferably has a thickness of 20 μm or greater and 200 μm or smaller, more preferably 40 μm or greater and 100 μm or smaller.

The resin 3 contains an antifouling agent that contains a compound containing a perfluoro(poly)ether group.

The antifouling agent preferably contains a compound that contains a perfluoro(poly)ether group and a curable moiety (e.g., an acrylate group). Specifically, the antifouling agent preferably contains a carbon-carbon double bond-containing compound (perfluoropolyether compound) that is a reaction product of a component (A) and a component (B), the component (A) being a polyisocyanate that is a trimer of a diisocyanate and the component (B) being an active-hydrogen-containing compound.

The component (A) is a polyisocyanate obtainable by trimerizing a diisocyanate. The polyisocyanate which is a trimer of a diisocyanate may be present in the form of a polymer thereof.

The component (A), i.e., a polyisocyanate that is a trimer of a diisocyanate, may preferably be an isocyanurate-type polyisocyanate. The isocyanurate-type polyisocyanate may be present in the form of a polymer thereof. In other words, the isocyanurate-type polyisocyanate may be a monocyclic compound containing only one isocyanurate ring, or a polycyclic compound obtained by polymerizing this monocyclic compound, or a mixture thereof. A known example of the isocyanurate-type polyisocyanate is "Sumidur® N3300" (Sumika Bayer Urethane Co., Ltd.).

Examples of the diisocyanate to be used for producing the component (A), i.e., a polyisocyanate that is a trimer of a diisocyanate, include, but are not limited to, diisocyanates in which an isocyanate group binds to an aliphatic group, such as hexamethylene diisocyanate, isophorone diisocyanate, xylylene diisocyanate, hydrogenated xylylene diisocyanate, and dicyclohexylmethane diisocyanate; and diisocyanates in which an isocyanate group binds to an aromatic group, such as tolylene diisocyanate, diphenylmethane diisocyanate, polymethylene polyphenyl polyisocyanate, tolidine diisocyanate, and naphthalene diisocyanate.

Examples of the component (A), i.e., a polyisocyanate that is a trimer of a diisocyanate, include, but are not limited to, compounds having a structure represented by the following formula (D6), (D7), (D8), or (D9).

[Chem. 1]

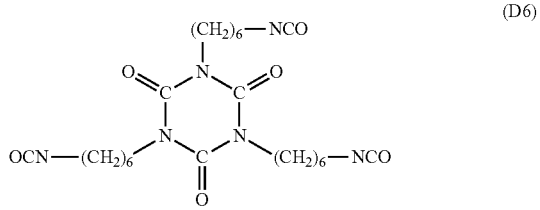

(D6)

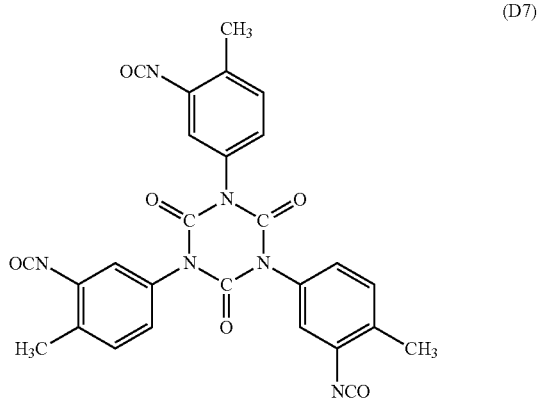

(D7)

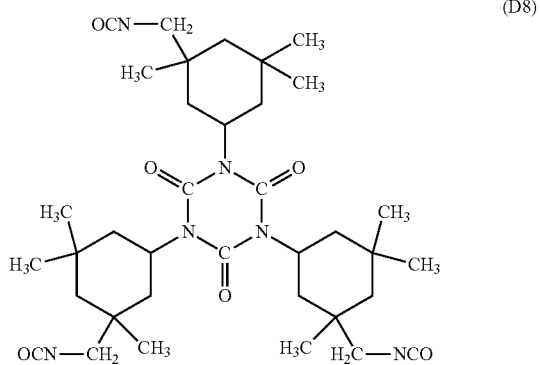

(D8)

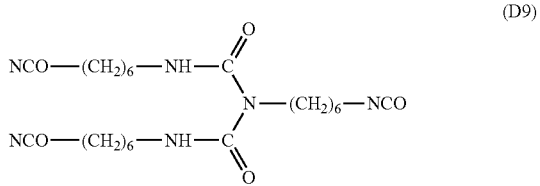

(D9)

As mentioned above, these polyisocyanates may be present in the form of a polymer. For example, an isocyanurate-type polyisocyanate of hexamethylene diisocyanate may be present in the form of a polymer having a structure represented by the following formula (D10).

[Chem. 2]

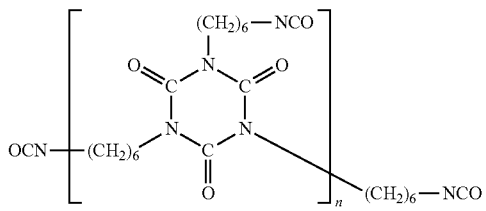

(D10)

The component (B) contains a component (B1) that is an active-hydrogen-containing perfluoropolyether and a component (B2) that is a monomer containing a carbon-carbon double bond-containing group and active hydrogen.

The component (B1) is at least one compound represented by one of the following formulas (B1-i) and (B1-ii). The component (B1) can improve the antifouling properties and the rubbing resistance (smoothness) of the antifouling film 1.

$$\text{Rf-PFPE}^1\text{-Z-X} \tag{B1-i}$$

$$\text{X-Z-PFPE}^2\text{-Z-X} \tag{B1-ii}$$

In the formulas (B1-i) and (B1-ii), Rf is a C1-C16 (e.g., linear or branched) alkyl group optionally substituted with one or more fluorine atoms, preferably a C1-C3 linear or branched alkyl group optionally substituted with one or more fluorine atoms. Rf is preferably linear. The alkyl group optionally substituted with one or more fluorine atoms is preferably a fluoroalkyl group in which the terminal carbon atoms are $CF_2H$— and the other carbon atoms are substituted with a fluorine atom, or a perfluoroalkyl group, more preferably a perfluoroalkyl group, specifically —$CF_3$, —$CF_2CF_3$, or —$CF_2CF_2CF_3$.

In the formulas (B1-i) and (B1-ii), PFPE$^1$ is a group represented by the following formula (D1), (D2), or (D3):

$$\text{—(OCF}_2\text{CF}_2\text{CF}_2\text{)}_b\text{—} \tag{D1}$$

wherein b is an integer of 1 to 200, preferably an integer of 5 to 200, more preferably an integer of 10 to 200;

$$\text{—(OCF}_2\text{CF}_2\text{CF}_2\text{CF}_2\text{)}_a\text{—(OCF}_2\text{CF}_2\text{CF}_2\text{)}_b\text{—} \\ \text{(OCF}_2\text{CF}_2\text{)}_c\text{—(OCF}_2\text{)}_d\text{—} \tag{D2}$$

wherein a and b are each individually an integer of 0 to 30; c and d are each individually an integer of 1 to 200, preferably an integer of 5 to 200, more preferably an integer of 10 to 200; and the repeating units parenthesized with a, b, c, or d are present in any order in the formula (D2); and $$\text{—(OC}_2\text{F}_4\text{—R}^5\text{)}_i\text{—} \tag{D3}$$

wherein R$^5$ is OC$_2$F$_4$, OC$_3$F$_6$, or OC$_4$F$_8$; and i is an integer of 2 to 100, preferably an integer of 2 to 50.

In an embodiment, in the formulas (B1-i) and (B1-ii), PFPE$^1$ may be a group represented by the formula (D1) or (D3), and is preferably a group represented by the formula (D1). The presence of such PFPE$^1$ can further improve the antifouling properties of the antifouling film 1.

In the formulas (B1-i) and (B1-ii), PFPE$^2$ is a group represented by the following formula (D4) or (D5), and is preferably a group represented by the following formula (D4):

$$\text{—(OCF}_2\text{CF}_2\text{CF}_2\text{)}_b\text{—} \tag{D4}$$

wherein b is an integer of 1 to 200, preferably an integer of 5 to 200, more preferably an integer of 10 to 200; and $$\text{—(OC}_2\text{F}_4\text{—R}^5\text{)}_i\text{—} \tag{D5}$$

wherein R$^5$ is OC$_2$F$_4$, OC$_3$F$_6$, or OC$_4$F$_8$; and i is an integer of 2 to 100, preferably an integer of 2 to 50.

In the formulas (B1-i) and (B1-ii), Zs are each individually a divalent organic group; each Z is preferably R$^1$; and R$^1$s are each individually a group represented by the following formula (D11).

$$\text{—(Y)}_f\text{—(CR}^3\text{}_2\text{)}_j\text{—} \tag{D11}$$

In the formula (D11), Y is a divalent polar group. Examples of the divalent polar group include, but are not limited to, —COO—, —OCO—, —CONH—, —OCH$_2$CH(OH)CH$_2$—, —CH$_2$CH(OH)CH$_2$O—, —COS—, —SCO—, and —O—. Preferred is —COO—, —CONH—, —CH$_2$CH(OH) CH$_2$O—, or —O—.

In the formula (D11), R$^3$s are each individually a hydrogen atom or a fluorine atom.

In the formula (D11), f is an integer of 0 to 50, preferably an integer of 0 to 20 (e.g., an integer of 1 to 20); j is an integer of 0 to 100, preferably an integer of 0 to 40 (e.g., an integer of 1 to 40); the sum of f and j is 1 or greater; and the repeating units parenthesized with f or j are present in any order in the formula (D11).

R$^1$s represented by the formula (D11) are preferably each individually a group represented by the following formula (D12).

$$\text{—(Y)}_f\text{—(CF}_2\text{)}_g\text{—(CH}_2\text{)}_h\text{—} \tag{D12}$$

In the formula (D12), Y and f are respectively defined in the same manner as Y and f in the formula (D11); g and h are each individually an integer of 0 to 50, preferably an integer of 0 to 20 (e.g., an integer of 1 to 20); the sum of f, g, and h is 1 or greater, preferably 1 to 10; f, g, and h are each more preferably an integer of 0 to 2, still more preferably f=0 or 1, g=2, and h=0 or 1; and the repeating units parenthesized with f, g, or h are present in any order in the formula (D12).

In the formulas (B1-i) and (B1-ii), X is an active-hydrogen-containing group. Xs are preferably each individually a —OH group, a —C(=O)H group, a —SH group, a —SO$_3$H group, a —SO$_2$H group, a —SOH group, a —NH$_2$ group, a —NH— group, or a —SiH group, more preferably a —OH group or a —NH$_2$ group, still more preferably a —OH group.

The component (B1) is preferably at least one compound represented by one of the following formulas (B1-i') and (B1-ii'), more preferably at least one compound represented by the following formula (B1-i'). In the component (B1) which is at least one compound represented by the following formula (B1-i'), PFPE$^1$ is preferably a group represented by the formula (D1). The compound represented by the following formula (B1-i') can further improve the rubbing resistance of the antifouling film 1.

$$\text{Rf-PFPE}^1\text{-R}^1\text{—CH}_2\text{OH} \tag{B1-i'}$$

$$\text{HOCH}_2\text{—R}^1\text{-PFPE}^2\text{-R}^1\text{—CH}_2\text{OH} \tag{B1-ii'}$$

In the formulas (B1-i') and (B1-ii'), Rf, PFPE$^1$, and PFPE$^2$ are respectively defined in the same manner as Rf, PFPE$^1$, and PFPE² in the formulas (B1-i) and (B1-ii). In the formulas (B1-i') and (B1-ii'), R¹ is defined in the same manner as R¹ represented by the formula (D11).

The component (B1), i.e., an active-hydrogen-containing perfluoropolyether, is a compound containing one active-hydrogen-containing group (e.g., a hydroxy group) at one molecular end or one active-hydrogen-containing hydroxy group at each of two molecular ends in addition to the perfluoropolyether group. The compound containing a perfluoropolyether group can improve the antifouling properties (e.g., water repellency, oil repellency, ease of wiping of fingerprints) of the antifouling film 1.

The component (B1), i.e., an active-hydrogen-containing perfluoropolyether, preferably has a number average molecular weight of, although not limited to, 500 to 12000, more preferably 1000 to 10000, still more preferably 1500 to 8000.

The component (B2), i.e., a monomer containing a carbon-carbon double bond-containing group and active hydrogen, contains at least one (preferably one) active-hydrogen-containing group (preferably a hydroxy group) at a molecular end thereof.

The component (B2), i.e., a monomer containing a carbon-carbon double bond-containing group and active hydrogen, preferably contains a group represented by the following formula (D13) as a carbon-carbon double bond-containing group.

$$—OC(O)—CR^2=CH_2 \quad (D13)$$

In the formula (D13), R² is a hydrogen atom, a chlorine atom, a fluorine atom, or a C1-C10 alkyl group optionally substituted with a fluorine atom, preferably a hydrogen atom or a C1-C3 alkyl group, more preferably a hydrogen atom or a methyl group. The groups in which R² is a hydrogen atom or a methyl group, i.e., —OC(O)—CH=CH₂ and —OC(O)—CCH₃=CH₂ are also collectively referred to as "(meth)acrylate groups".

Examples of the component (B2) include, but are not limited to, the following compounds:

$$HO(CH_2CH_2)_iOCO(R)C=CH_2 \quad (D14)$$

(wherein R is a hydrogen atom, a chlorine atom, a fluorine atom, or a C1-C10 alkyl group optionally substituted with a fluorine atom; and i is an integer of 2 to 10), such as 2-hydroxyethyl (meth)acrylate and 4-hydroxybutyl (meth)acrylate;

$$CH_3CH(OH)CH_2OCO(R)C=CH_2 \quad (D15)$$

(wherein R is a hydrogen atom, a chlorine atom, a fluorine atom, or a C1-C10 alkyl group optionally substituted with a fluorine atom), such as 2-hydroxypropyl (meth)acrylate;

$$CH_3CH_2CH(OH)CH_2OCO(R)C=CH_2 \quad (D16)$$

(wherein R is a hydrogen atom, a chlorine atom, a fluorine atom, or a C1-C10 alkyl group optionally substituted with a fluorine atom), such as 2-hydroxybutyl (meth)acrylate;

$$C_6H_5OCH_2CH(OH)CH_2OCO(R)C=CH_2 \quad (D17)$$

(wherein R is a hydrogen atom, a chlorine atom, a fluorine atom, or a C1-C10 alkyl group optionally substituted with a fluorine atom), such as 2-hydroxy-3-phenoxypropyl (meth)acrylate;

$$HOCH_2C(CH_2OCO(R)C=CH_2)_3 \quad (D18)$$

(wherein R is a hydrogen atom, a chlorine atom, a fluorine atom, or a C1-C10 alkyl group optionally substituted with a fluorine atom), such as pentaerythritol triacrylate;

$$C(CH_2OCO(R)C=CH_2)_3CH_2OCH_2C(CH_2OCO(R)C=CH_2)_2CH_2OH \quad (D19)$$

(wherein R is a hydrogen atom, a chlorine atom, a fluorine atom, or a C1-C10 alkyl group optionally substituted with a fluorine atom), such as dipentaerythritol polyacrylate;

$$HOCH_2CH_2OCOC_6H_5OCOCH_2CH_2OCO(R)C=CH_2 \quad (D20)$$

(wherein R is a hydrogen atom, a chlorine atom, a fluorine atom, or a C1-C10 alkyl group optionally substituted with a fluorine atom), such as 2-acryloyloxyethyl-2-hydroxyethyl phthalate;

$$H(OCH_2CH_2)_nOCO(R)C=CH_2 \quad (D21)$$

(wherein R is a hydrogen atom, a chlorine atom, a fluorine atom, or a C1-C10 alkyl group optionally substituted with a fluorine atom; and n is an integer of 1 to 30), such as poly(ethylene glycol) acrylate;

$$H(OCH(CH_3)CH_2)_nOCO(R)C=CH_2 \quad (D22)$$

(wherein R is a hydrogen atom, a chlorine atom, a fluorine atom, or a C1-C10 alkyl group optionally substituted with a fluorine atom; and n is an integer of 1 to 30), such as poly(propylene glycol) acrylate;

allylalcohol;

$$HO(CH_2)_kCH=CH_2 \quad (D23)$$

(wherein k is an integer of 2 to 20);

$(CH_3)_3SiCH(OH)CH=CH_2$; and styrylphenols.

In an embodiment, the component (B) may contain a component (B1) and a component (B2).

The carbon-carbon double bond-containing compound contained in the antifouling agent may contain groups derived from different components (B1) in one triisocyanate molecule. Also, this compound may contain groups derived from different components (B2) (e.g., containing different numbers of carbon-carbon double bonds) in one triisocyanate molecule.

The antifouling agent may contain one or more carbon-carbon double bond-containing compounds. For example, the antifouling agent may be a mixture of a compound obtained by reacting the component (A), a compound B1 as the component (B1), and a compound B2 as the component (B2), and a compound obtained by reacting the component (A), a compound B1' as the component (B1), and a compound B2' as the component (B2). These compounds may be synthesized simultaneously, or may be synthesized separately and then mixed with each other.

Examples of known antifouling agents include "Optool® DAC" and "Optool DAC-HP" (Daikin Industries, Ltd.), "KY-1203" and "KNS5300" (Shin-Etsu Chemical Co., Ltd.), "Megaface® RS-75", "Megaface RS-72-K", "Megaface RS-76-E", "Megaface RS-76-NS", "Megaface RS-90", "Defensa® TF3028", "Defensa TF3001", and "Defensa TF3000" (DIC Corp.), "SUA1900L10" and "SUA1900L6" (Shin Nakamura Chemical Co., Ltd.), and "Fluorolink® P56", "Fluorolink P54", "Fluorolink F10", "Fluorolink A10P", "Fluorolink AD1700", "Fluorolink MD700", and "Fluorolink E10H" (Solvay).

The resin 3 preferably contains 0.1 to 10 wt %, more preferably 0.5 to 5 wt %, of an active component of the antifouling agent. Less than 0.1 wt % of the active component of the antifouling agent in the resin 3 may cause too small an amount of the active component of the antifouling agent on the surface (the surface opposite to the substrate 2) of the polymer layer 6. This may cause insufficient antifouling properties and poor rubbing resistance. More than 10 wt % of the active component of the antifouling agent in the resin 3 may cause too large an amount of the active component of the antifouling agent on the surface (the surface opposite to the substrate 2) of the polymer layer 6. This may cause poor elasticity of the polymer layer 6 (projections 7), and the projections 7 fallen by rubbing the surface (the surface opposite to the substrate 2) of the polymer layer 6 may be less likely to rise (restore) again. As a result, the rubbing resistance may be poor.

The resin 3 may further contain a compatibilizer that is compatible with the above antifouling agent. The compatibilizer can prevent occurrence of cloudiness even when the resin 3 contains a large amount of the antifouling agent.

Examples of the compatibilizer include N-acryloylmorpholine (e.g., "ACMO®" (KJ Chemicals Corp.)), N,N-diethylacrylamide (e.g., "DEAA®" (KJ Chemicals Corp.)), N,N-dimethylacrylamide (e.g., "DMAA®" (KJ Chemicals Corp.)), tetrahydrofurfuryl acrylate (e.g., "Viscoat #150" (Osaka Organic Chemical Industry Ltd.)), cyclic trimethylolpropane formal acrylate (e.g., "Viscoat #200" (Osaka Organic Chemical Industry Ltd.)), 4-hydroxybutyl (meth) acrylate (e.g., "4HBA" (Nippon Kasei Chemical Co., Ltd.)), phenoxyethyl acrylate, benzyl acrylate, stearyl acrylate, lauryl acrylate, 2-ethylhexyl acrylate, allyl acrylate, 1,3-butanediol diacrylate, 1,4-butanediol diacrylate, 1,6-hexanediol diacrylate, pentaerythritol triacrylate, dipentaerythritol hexaacrylate, glycidyl acrylate, diethylene glycol diacrylate, polyoxyethylene glycol diacrylate, tripropylene glycol diacrylate, 2-hydroxyethyl acrylate, 4-hydroxybutylvinyl ether, N,N-dimethylaminoethyl acrylate, N-vinylpyrrolidone, dimethylaminoethyl (meth)acrylate, silicone-based acrylates, 2,2,3,3-tetrafluoropropyl (meth)acrylate, 2,2,3,3,4,4,5,5-octafluoropropyl (meth)acrylate, methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, t-butyl (meth)acrylate, n-pentyl (meth)acrylate, 3-methylbutyl (meth)acrylate, n-hexyl (meth)acrylate, 2-ethyl-n-hexyl (meth)acrylate, n-octyl (meth)acrylate, cyclohexyl (meth)acrylate, isobornyl (meth) acrylate, benzyl (meth)acrylate, 2-hydroxyethyl (meth)acrylate, 2-hydroxypropyl (meth)acrylate, 3-hydroxypropyl (meth)acrylate, 5-hydroxypentyl (meth)acrylate, 6-hydroxyhexyl (meth)acrylate, 4-hydroxycyclohexyl (meth)acrylate, neopentylglycol mono(meth)acrylate, 3-chloro-2-hydroxypropyl (meth)acrylate, (1,1-dimethyl-3-oxobutyl) (meth) acrylate, 2-acetoacetoxyethyl (meth)acrylate, 2-methoxyethyl (meth)acrylate, 2-ethoxyethyl (meth)acrylate, neopentylglycol mono(meth)acrylate, 3-chloro-2-hydroxypropyl (meth)acrylate, glycerol mono(meth)acrylate, ethylene glycol diacrylate, propylene glycol diacrylate, 1,6-hexanediol diacrylate, 1,9-nonanediol diacrylate, 1,10-decanediol diacrylate, trimethylolpropane triacrylate, and pentaerythritol tetraacrylate. The compatibilizer is preferably a monofunctional monomer containing a polar group such as an amide group, an ether group, or a hydroxy group. In the resin 3, the compatibilizer may be contained in the antifouling agent, or in a component other than the antifouling agent, or in both of them.

The resin 3 preferably contains 10 to 40 wt %, more preferably 20 to 30 wt %, of the compatibilizer. Less than 10 wt % of the compatibilizer in the resin 3 may cause poor solubility of the antifouling agent in the compatibilizer. More than 40 wt % of the compatibilizer in the resin 3 may soften the polymer layer 6, reducing the elasticity. This may result in poor rubbing resistance of the antifouling film 1.

The resin 3 used may include one or two or more curable resins, one or two or more curable monomers, or a mixture of a curable resin and a curable monomer.

The curable resin may be any resin having heat resistance and sufficient strength, and may be any of a photo-curable resin and a thermosetting resin. An ultraviolet-curable resin is more preferred.

Examples of the curable resin include acrylic polymers, polycarbonate polymers, polyester polymers, polyamide polymers, polyimide polymers, polyethersulfone polymers, cyclic polyolefin polymers, fluorine-containing polyolefin polymers (e.g., PTFE), and fluorine-containing cyclic amorphous polymers. In the case of performing a treatment such as curing by ultraviolet irradiation after the formation of an uneven structure (the above Process (2)), the curable resin is preferably a resin having transparency.

Specific examples of the curable resin include alkyl vinyl ethers such as cyclohexyl methyl vinyl ether, isobutyl vinyl ether, cyclohexyl vinyl ether, and ethyl vinyl ether, glycidyl vinyl ether, vinyl acetate, vinyl pivalate, (meth)acrylates such as phenoxyethyl acrylate, benzyl acrylate, stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, ethoxyethyl acrylate, methoxyethyl acrylate, glycidyl acrylate, tetrahydrofurfuryl acrylate, diethylene glycol diacrylate, neopentyl glycol diacrylate, polyoxyethylene glycol diacrylate, tripropylene glycol diacrylate, 2-hydroxyethyl acrylate, 2-hydroxypropyl acrylate, N,N-diethylaminoethyl acrylate, N,N-dimethylaminoethyl acrylate, dimethylaminoethyl methacrylate, and silicone-based acrylates, 4-hydroxybutyl vinyl ether, N-vinylpyrrolidone, maleic anhydride, vinylene carbonate, chainlike side chain polyacrylates, cyclic side chain polyacrylates, polynorbornene, polynorbornadiene, polycarbonate, polysulfonamide, and fluorine-containing cyclic amorphous polymers (e.g., Cytop®, Teflon® AF).

The curable monomer may be either a photo-curable monomer or a thermosetting monomer, and is preferably an ultraviolet-curable monomer.

Examples of the curable monomer include (a) urethane (meth)acrylates, (b) epoxy (meth)acrylates, (c) polyester (meth)acrylates, (d) polyether (meth)acrylates, (e) silicone (meth)acrylates, and (f) (meth)acrylate monomers.

Specific examples of the curable monomer include the following.

The urethane (meth)acrylates (a) are those containing a urethane bond and a (meth)acryloyl group in a molecule. Examples of the urethane (meth)acrylates (a) include poly ((meth)acryloyloxyalkyl)isocyanurates typified by tris(2-hydroxyethyl)isocyanurate diacrylate and tris(2-hydroxyethyl) isocyanurate triacrylate.

The epoxy (meth)acrylates (b) are obtained by adding a (meth)acryloyl group to an epoxy group, typified by those obtained from a starting material such as bisphenol A, bisphenol F, phenol novolac, or an alicyclic compound.

The polyester (meth)acrylates (c) may be ester resins containing a polyhydric alcohol and a polybasic acid with a (meth)acrylate added thereto. Examples of the polyhydric alcohol include ethylene glycol, 1,4-butanediol, 1,6-hexanediol, diethylene glycol, trimethylolpropane, dipropylene glycol, polyethylene glycol, polypropylene glycol, pentaerythritol, and dipentaerythritol. Examples of the polybasic acid include phthalic acid, adipic acid, maleic acid, trimellitic acid, itaconic acid, succinic acid, terephthalic acid, and alkenylsuccinic acid.

The polyether (meth)acrylates (d) are polyether resins of a diol with a (meth)acrylate added thereto. Examples of the polyether (meth)acrylates (d) include polyethylene glycol di(meth)acrylate, polypropylene glycol di(meth)acrylate, and polyethylene glycol-polypropylene glycol di(meth) acrylate.

The silicone (meth)acrylates (e) are those obtained by modifying at least one end of dimethyl polysiloxane having a molecular weight of 1000 to 10000 with a (meth)acryloyl group, and examples thereof include compounds represented by the following formula (D24), (D25), or (D26).

[Chem. 3]

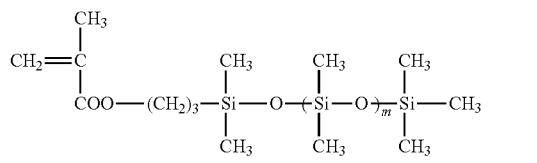
(D24)

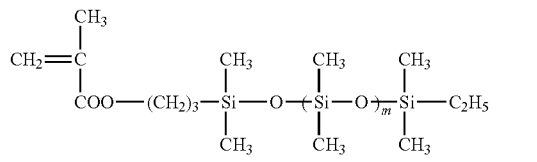
(D25)

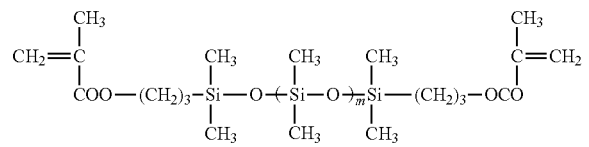
(D26)

The (meth)acrylate monomers (f) are monofunctional or multifunctional alkyl (meth)acrylates or polyether (meth) acrylates having a low viscosity of 500 mPa·s or lower (25° C.). Examples of the (meth)acrylate monomers (f) include methyl (meth)acrylate, ethyl (meth)acrylate, n-propyl (meth)acrylate, isopropyl (meth)acrylate, n-butyl (meth) acrylate, isobutyl (meth)acrylate, sec-butyl (meth)acrylate, t-butyl (meth)acrylate, n-pentyl (meth)acrylate, 3-methylbutyl (meth)acrylate, n-hexyl (meth)acrylate, 2-ethyl-n-hexyl (meth)acrylate, n-octyl (meth)acrylate, cyclohexyl (meth)acrylate, isobornyl (meth)acrylate, benzyl (meth) acrylate, 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentyl glycol mono(meth)acrylate, 3-chloro-2-hydroxypropyl (meth)acrylate, (1,1-dimethyl-3-oxobutyl) (meth)acrylate, 2-acetoacetoxyethyl (meth)acrylate, 2-methoxyethyl (meth)acrylate, 2-ethoxyethyl (meth) acrylate, neopentyl glycol mono(meth)acrylate, 3-chloro-2-hydroxypropyl (meth)acrylate, glycerol mono(meth) acrylate, ethylene glycol diacrylate, propylene glycol diacrylate, 1,6-hexanediol diacrylate, 1,9-nonanediol diacrylate, 1,10-decanediol diacrylate, trimethylolpropane triacrylate, and pentaerythritol tetraacrylate.

Preferred examples of known curable resins and curable monomers are as follows.

Examples of the curable resins include silicone resins (e.g., "PAK-01" and "PAK-02", Toyo Gosei Co., Ltd.); nanoimprint resins (e.g., "NIF" series, Asahi Glass Co., Ltd.; "OCNL" series, Tokyo Ohka Kogyo Co., Ltd.; and "NIAC2310", Daicel Chemical Industries, Co., Ltd.); epoxy acrylate resins (e.g., "EH-1001", "ES-4004", "EX-C101", "EX-C106", "EX-C300", "EX-0501", "EX-0202", "EX-0205", and "EX-5000", Kyoeisha Chemical Co., Ltd.); and hexamethylene diisocyanate-based polyisocyanates and isocyanurate-type polyisocyanates (e.g., "Sumidur N-75", "Sumidur N3200", "Sumidur HT", "Sumidur N3300", and "Sumidur N3500", Sumika Bayer Urethane Co., Ltd.).

Examples of the silicone acrylate resins among the curable monomers include: "Silaplane® FM-0611", "Silaplane FM-0621", and "Silaplane FM-0625"; bi-terminal-type (meth)acrylate resins such as "Silaplane FM-7711", "Silaplane FM-7721", and "Silaplane FM-7725"; "Silaplane FM-0411", "Silaplane FM-0421", "Silaplane FM-0428", "Silaplane FM-DA11", "Silaplane FM-DA21", and "Silaplane DA25"; mono-terminal-type (meth)acrylate resins such as "Silaplane FM-0711", "Silaplane FM-0721", "Silaplane FM-0725", "Silaplane TM-0701", and "Silaplane TM-0701T" (JNC Co., Ltd.).

Examples of the multifunctional acrylates among the curable monomers include "U-10HA", "U-10PA", "UA-33H", "UA-53H", "UA-1100H", "UA-7000", "UA-7100", "ATM-4E", "ATM-35E", "A-DPH", "A-9300", "A-9300-1CL", "A-GLY-9E", "A-GLY-20E", "A-TMM-3", "A-TMM-3L", "A-TMM-3LM-N", "A-TMPT", and "A-TMMT" (Shin-Nakamura Chemical Co., Ltd.); "UA-306H", "UA-53T", "UA-510H", "Light Acrylate PE-3A", and "Light Acrylate DPE-6A" (Kyoeisha Chemical Co., Ltd.); and "PET-3" (DKS Co., Ltd.).

An example of the multifunctional methacrylates among the curable monomers is "TMPT" (Shin-Nakamura Chemical Co., Ltd.).

Examples of the alkoxysilane group-containing (meth) acrylates among the curable monomers include 3-(meth) acryloyloxypropyltrichlorosilane, 3-(meth)acryloyloxypropyltrimethoxysilane, 3-(meth)acryloyloxypropyltriethoxysilane, 3-(meth)acryloyloxypropyltriisopropoxysilane (also referred to as (triisopropoxysilyl)propyl methacrylate (abbreviation: TISMA) and (triisopropoxysilyl)propyl acrylate), 3-(meth) acryloxyisobutyltrichlorosilane, 3-(meth)acryloxyisobutyltriethoxysilane, 3-(meth)acryloxyisobutyltriisopropoxysilane, and 3-(meth)acryloxyisobutyltrimethoxysilane.

The amount of the curable resin or the curable monomer is preferably 5 to 99 parts by mass, more preferably 10 to 99 parts by mass, still more preferably 50 to 99 parts by mass, with the whole amount of the resin 3 taken as 100 parts by mass. The curable resin or monomer in such an amount can lead to a uniform composition without phase separation.

The resin 3 may further contain a crosslinking catalyst. Examples of the crosslinking catalyst include polymerization initiators and acid generators.

Examples of the polymerization initiators include radical polymerization initiators, anionic polymerization initiators, and cationic polymerization initiators. The resin 3 may contain one or multiple of these polymerization initiators.

The radical polymerization initiators are compounds that generate a radical by application of heat or light, for example. Examples of the radical polymerization initiators include radical thermal polymerization initiators and radical photo-polymerization initiators.

Examples of the radical thermal polymerization initiators include: peroxide compounds, including diacyl peroxides such as benzoyl peroxide and lauroyl peroxide, dialkyl peroxides such as dicumyl peroxide and di-t-butyl peroxide, peroxy carbonates such as diisopropyl peroxydicarbonate and bis(4-t-butylcyclohexyl)peroxydicarbonate, and alkyl peresters such as t-butyl peroxyoctoate and t-butyl peroxybenzoate; and radical-generating azo compounds such as azobisisobutyronitrile.

Examples of the radical photo-polymerization initiators include: -diketones such as benzyl and diacetyl; acyloins such as benzoin; acyloin ethers such as benzoin methyl ether, benzoin ethyl ether, benzoin propyl ether, benzoin isobutyl ether, and benzoin isopropyl ether; thioxanthones such as thioxanthone, 2,4-diethyl thioxanthone, 2-isopropyl thioxanthone, 2-chlorothioxanthone, and thioxanthone-4-sulfonic acid; benzophenones such as benzophenone, 4-benzoyl-4'-methyldiphenylsulfide, 4,4'-bismethylaminobenzophenone, 4,4'-bis(dimethylamino)benzophenone, and 4,4'-bis(diethylamino)benzophenone; acetophenones such as acetophenone, 2-(4-toluenesulfonyloxy)-2-phenylacetophenone, p-dimethylaminoacetophenone, 2,2'-dimethoxy-2-phenylacetophenone, 2,2-diethoxy-2-phenylacetophenone, 1,1-dichloroacetophenone, 2-hydroxy-2-methyl-phenylpropan-1-one, diethoxyacetophenone, 1-hydroxycyclohexylphenylketone, 2-methyl-1-[4-(methylthio) phenyl]-2-morpholinopropan-1-one, p-methoxyacetophenone, 2-methyl[4-(methylthio)phenyl]-2-morpholino-1-propanone, and 2-benzyl-2-dimethylamino-1-(4-morpholinophenyl)-butan-1-one; quinones such as anthraquinone, 2-ethylanthraquinone, 2-t-butylanthraquinone, 2-chloroanthraquinone, 2-amylanthraquinone, and 1,4-naphthoquinone; ketals such as acetophenone dimethyl ketal and benzyl dimethyl ketal; aminobenzoic acids such as ethyl 2-dimethylaminobenzoate, ethyl 4-dimethylaminobenzoate, (n-butoxy)ethyl 4-dimethylaminobenzoate, isoamyl 4-dimethylaminobenzoate, and 2-ethylhexyl 4-dimethylaminobenzoate; halogen compounds such as phenacyl chloride and trihalomethyl phenyl sulfone; acylphosphine oxides such as 2,4,6-trimethylbenzoyl-diphenyl-phosphine oxide, bis-(2,6-dimethoxybenzoyl)-2,4,4-trimethylpentylphosphine oxide, and bis(2,4,6-trimethylbenzoyl)-phenylphosphine oxide; peroxides such as di-t-butyl peroxide; and mixtures thereof. In order to achieve good light resistance, i.e., to reduce yellowing of the polymer layer 6, preferred are 2,4,6-trimethylbenzoyl-diphenyl-phosphine oxide and bis(2,4,6-trimethylbenzoyl)-phenylphosphine oxide.

Examples of known radical photo-polymerization initiators include:

"Irgacure® 651" (BASF SE): 2,2-dimethoxy-1,2-diphenylethan-1-one, "Irgacure 184" (BASF SE): 1-hydroxy-cyclohexyl-phenyl-ketone, "Irgacure 2959" (BASF SE): 1-[4-(2-hydroxyethoxy)-phenyl]-2-hydroxy-2-methyl-1-propan-1-one, "Irgacure 127" (BASF SE): 2-hydroxy-1-{4-[4-(2-hydroxy-2-methyl-propionyl)-benzyl]-phenyl}-2-methyl-propan-1-one, "Irgacure 907" (BASF SE): 2-methyl-1-(4-methylthiophenyl)-2-morpholinopropan-1-one, "Irgacure 369" (BASF SE): 2-benzyl-2-dimethylamino-1-(4-morpholinophenyl)-1-butanone, "Irgacure 379" (BASF SE): 2-(dimethylamino)-2-[(4-methylphenyl)methyl]-1-[4-(4-morpholinyl)phenyl]-1-butanone, "Irgacure 819" (BASF SE): bis(2,4,6-trimethylbenzoyl)-phenylphosphine oxide, "Irgacure 784" (BASF SE): bis(η5-2,4-cyclopentadien-1-yl)-bis(2,6-difluoro-3-(1H-pyrrol-1-yl)-phenyl)titanium, "Irgacure OXE 01" (BASF SE): 1,2-octanedione, 1-[4-(phenylthio)-, 2-(O-benzoyloxime), "Irgacure OXE 02" (BASF SE): ethanone, 1-[9-ethyl-6-(2-methylbenzoyl)-9H-carbazol-3-yl]-, 1-(0-acetyloxime), "Irgacure 261" (BASF SE), "Irgacure 369" (BASF SE), "Irgacure 500" (BASF SE), "Irgacure TPO" (BASF SE): 2,4,6-trimethylbenzoyl-diphenyl-phosphine oxide, "DAROCUR® 1173" (BASF SE): 2-hydroxy-2-methyl-1-phenyl-propan-1-one,

"DAROCUR 1116" (BASF SE),

"DAROCUR 2959" (BASF SE),

"DAROCUR 1664" (BASF SE),

"DAROCUR 4043" (BASF SE),

"Irgacure 754" (BASF SE): Mixture of oxy-phenylacetic acid 2-[2-oxo-2-phenylacetoxyethoxy]ethyl ester and oxy-phenylacetic acid 2-(2-hydroxyethoxy)ethyl ester, "Irgacure 500" (BASF SE): Mixture of "Irgacure 184" (BASF SE) and benzophenone (weight ratio 1:1), "Irgacure 1300" (BASF SE): Mixture of "Irgacure 369" (BASF SE) and "Irgacure 651" (BASF SE) (weight ratio 3:7), "Irgacure 1800" (BASF SE): Mixture of "CGI403" (BASF SE) and "Irgacure 184" (BASF SE) (weight ratio 1:3), "Irgacure 1870" (BASF SE): Mixture of "CGI403" (BASF SE) and "Irgacure 184" (BASF SE) (weight ratio 7:3), and "Darocur 4265" (BASF SE): Mixture of "Irgacure TPO" (BASF SE) and "Darocur 1173" (BASF SE) (weight ratio 1:1).

The crosslinking catalyst which is a radical photo-polymerization initiator may be used in combination with a sensitizer such as diethyl thioxanthone or isopropyl thioxanthone and with a polymerization accelerator such as "Darocur EDB" (ethyl-4-dimethylaminobenzoate, BASF SE) and "Darocur EHA" (2-ethylhexyl-4-dimethylaminobenzoate, BASF SE).

The amount of the sensitizer when used is preferably 0.1 to 5 parts by mass, more preferably 0.1 to 2 parts by mass, relative to 100 parts by mass of the curable resin or the curable monomer in the resin 3.

The amount of the polymerization accelerator when used is preferably 0.1 to 5 parts by mass, more preferably 0.1 to 2 parts by mass, relative to 100 parts by mass of the curable resin or the curable monomer in the resin 3.

The acid generators are materials that generate an acid by application of heat or light. Examples of the acid generators include thermal acid generators and photo-acid generators. Photo-acid generators are preferred.

Examples of the thermal acid generators include benzoin tosylate, nitrobenzyl tosylate (especially, 4-nitrobenzyl tosylate), and alkyl esters of other organic sulfonic acids.

The photo-acid generators are composed of a chromophore that absorbs light and an acid precursor that is to be converted into an acid after decomposition. Application of light of a specific wavelength to a photo-acid generator of such a structure excites the photo-acid generator, generating an acid from the acid precursor moiety.

Examples of the photo-acid generators include salts such as diazonium salts, phosphonium salts, sulfonium salts, iodonium salts, $CF_3SO_3$, $p\text{-}CH_3PhSO_3$, and $p\text{-}NO_2PhSO_3$ (wherein Ph is a phenyl group), organohalogen compounds, orthoquinone-diazide sulfonyl chloride, sulfonic acid esters, 2-halomethyl-5-vinyl-1,3,4-oxadiazole compounds, 2-trihalomethyl-5-aryl-1,3,4-oxadiazole compounds, and 2-trihalomethyl-5-hydroxyphenyl-1,3,4-oxadiazole compounds.

The organohalogen compounds are compounds that generate a hydrohalic acid (e.g., hydrogen chloride).

Examples of known photo-acid generators include the following.

"WPAG-145" (Wako Pure Chemical Industries, Ltd.): bis(cyclohexylsulfonyl)diazomethane "WPAG-170" (Wako Pure Chemical Industries, Ltd.): bis(t-butylsulfonyl)diazomethane "WPAG-199" (Wako Pure Chemical Industries, Ltd.): bis(p-toluenesulfonyl)diazomethane "WPAG-281" (Wako Pure Chemical Industries, Ltd.): triphenylsulfonium trifluoromethanesulfonate "WPAG-336" (Wako Pure Chemical Industries, Ltd.): diphenyl-4-methylphenylsulfonium trifluoromethanesulfonate "WPAG-367" (Wako Pure Chemical Industries, Ltd.): diphenyl-2,4,6-trimethylphenylsulfonium p-toluenesulfonate "Irgacure PAG103" (BASF SE): (5-propylsulfonyloxyimino-5H-thiophen-2-ylidene)-(2-methylphenyl)acetonitrile "Irgacure PAG108" (BASF SE): (5-octylsulfonyloxyimino-5H-thiophen-2-ylidene)-(2-methylphenyl)acetonitrile "Irgacure PAG121" (BASF SE): (5-p-toluenesulfonyloxyimino-5H-thiophen-2-ylidene)-(2-methylphenyl)acetonitrile "Irgacure PAG203" (BASF SE)

"CGI 725" (BASF SE)

"TFE-triazine" (Sanwa Chemical Co.): 2-[2-(furan-2-yl)ethenyl]-4,6-bis(trichloromethyl)-s-triazine "TME-triazine" (Sanwa Chemical Co.): 2-[2-(5-methylfuran-2-yl)ethenyl]-4,6-bis(trichloromethyl)-s-triazine "MP-triazine" (Sanwa Chemical Co.): 2-(methoxyphenyl)-4,6-bis(trichloromethyl)-s-triazine "Dimethoxytriazine" (Sanwa Chemical Co.): 2-[2-(3,4-dimethoxyphenyl)ethenyl]-4,6-bis(tri-chloromethyl)-s-triazine The amount of the crosslinking catalyst is preferably 0.1 to 10 parts by mass, more preferably 0.3 to 5 parts by mass, still more preferably 0.5 to 2 parts by mass, relative to 100 parts by mass of the curable resin or the curable monomer in the resin 3. The crosslinking catalyst in an amount within this range can lead to sufficient curing of the resin 3.

When an acid generator is used as the crosslinking catalyst, an acid scavenger may be added as appropriate to control diffusion of the acid generated from the acid generator.

The acid scavenger may be any one that does not impair the sublimation and the performance of the resin 3, and is preferably a basic compound such as an amine (particularly, an organic amine), a basic ammonium salt, or a basic sulfonium salt, more preferably an organic amine.

Examples of the acid scavenger include 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethylamine, and tributylamine. Preferred among these are organic amines such as 1,5-diazabicyclo[4.3.0]-5-nonene, 1,8-diazabicyclo[5.4.0]-7-undecene, 1,4-diazabicyclo[2.2.2]octane, 4-dimethylaminopyridine, 1-naphthylamine, piperidine, hexamethylenetetramine, imidazoles, hydroxypyridines, pyridines, 4,4'-diaminodiphenyl ether, triethylamine, and tributylamine.

The amount of the acid scavenger is preferably 20 parts by mass or less, more preferably 0.1 to 10 parts by mass, still more preferably 0.5 to 5 parts by mass, relative to 100 parts by mass of the acid generator.

The resin 3 may contain a solvent (particularly, a water-soluble organic solvent, an organic solvent (especially, an oil-soluble organic solvent), or water), as appropriate.

Examples of the water-soluble organic solvent include acetone, methyl ethyl ketone, methyl amyl ketone, ethyl acetate, propylene glycol, propylene glycol monomethyl ether, propylene glycol monomethyl ether acetate (PGMEA), dipropylene glycol, dipropylene glycol monomethyl ether, dipropylene glycol dimethyl ether, dipropylene glycol monomethyl ether acetate, dipropylene glycol diacetate, tripropylene glycol, 3-methoxybutyl acetate (MBA), 1,3-butylene glycol diacetate, cyclohexanol acetate, dimethyl formamide, dimethyl sulfoxide, methyl cellosolve, cellosolve acetate, butyl cellosolve, butyl carbitol, carbitol acetate, ethyl lactate, isopropyl alcohol, methanol, and ethanol.

Examples of the organic solvent include alcohols (e.g., methanol, ethanol, n- or i-propanol, n-, sec-, or t-butanol, benzyl alcohol, and octanol), ketones (e.g., acetone, methyl ethyl ketone, methyl isobutyl ketone, diisobutyl ketone, dibutyl ketone, and cyclohexanone), esters or ether esters (e.g., ethyl acetate, butyl acetate, and ethyl lactate), ethers (e.g., EG monomethyl ether (methyl cellosolve), EG monoethyl ether (ethyl cellosolve), diethylene glycol monobutyl ether (butyl cellosolve), and propylene glycol monomethyl ether), aromatic hydrocarbons (e.g., benzene, toluene, and xylene), amides (e.g., dimethylformamide, dimethylacetamide, and N-methylpyrrolidone), halogenated hydrocarbons (e.g., methylene dichloride and ethylene dichloride), petroleum-based solvents (e.g., petroleum ether and petroleum naphtha), γ-butyrolactone, ethylene glycol monomethyl acetate, propylene glycol monomethyl acetate, chloroform, HCFC141b, HCHC225, hydrofluoroether, pentane, hexane, heptane, octane, cyclohexane, tetrahydrofuran, 1,4-dioxane, 1,1,2,2-tetrachloroethane, 1,1,1-trichloroethane, trichloroethylene, perchloroethylene, tetrachlorodifluoroethane, and trichlorotrifluoroethane.

The resin 3 may contain one or multiple of these solvents. In order to achieve good solubility and safety of the components in the resin 3, propylene glycol monomethyl ether acetate and 3-methoxybutyl acetate are preferred.

The resin 3, when containing a solvent, preferably has a solvent content in the resin 3 of 30 to 95 mass %, more preferably 50 to 90 mass %.

The resin 3 may contain a solvent if necessary as mentioned above, but preferably contains no solvent. In other words, the resin 3 is preferably a solvent-free resin. The solvent-free resin enables reduction in the cost relating to the use of a solvent and in environmental load (e.g., bad odor in use). Further, this configuration eliminates the need for a device for removing a solvent, enabling reduction in the cost relating to such a device. In contrast, if the resin 3 contains a solvent, the antifouling agent may be mixed excessively, so that the fluorine atom concentration on the surface (the surface opposite to the substrate 2) of the polymer layer 6 may be low. Further, such a resin 3 may have high volatility, so that the ease of application thereof may unfortunately be poor.

The resin 3 may further contain a crosslinker.

The crosslinker is a monofunctional compound or preferably a multifunctional compound containing two or more functional groups. The crosslinker is preferably one curable by radical polymerization reaction, and may be one curable by cationic polymerization reaction. The crosslinker curable by radical polymerization reaction contains a functional group such as an acryloyl group or a vinyl group which is an unsaturated double bond group. The crosslinker curable by cationic polymerization reaction contains a functional group such as an epoxy group, a vinyl ether group, or an oxetane group.

Examples of the crosslinker include (a) urethane (meth)acrylates, (b) epoxy (meth)acrylates, (c) polyester (meth)acrylates, (d) polyether (meth)acrylates, (e) silicone (meth)acrylates, (f) (meth)acrylate monomers, (g) epoxy monomers, (h) vinyl ether monomers, and (i) oxetane monomers. The crosslinkers (a) to (f) are those curable by radical polymerization reaction and the crosslinkers (g) to (i) are those curable by cationic polymerization reaction.

The crosslinkers (a) to (e) contain a (meth)acryloyl group added to the resin, and may also be expressed as oligomers, base resins, or prepolymers in many cases.

The urethane (meth)acrylates (a) are those containing a urethane bond and a (meth)acryloyl group in a molecule. Examples of the urethane (meth)acrylates (a) include poly((meth)acryloyloxyalkyl)isocyanurates typified by tris(2-hydroxyethyl)isocyanurate diacrylate and tris(2-hydroxyethyl)isocyanurate triacrylate. The isocyanurates are trifunctional isocyanate compounds. One of these isocyanates may form a urethane bond together with an alkyl group (carbon number 1 to 20), a fluoroalkyl group (carbon number 1 to 6), or a perfluoropolyether group (molecular weight 1000 to 50000) and a compound containing a hydroxy group in one molecule.

The epoxy (meth)acrylates (b) are obtained by adding a (meth)acryloyl group to an epoxy group, typified by those obtained from a starting material such as bisphenol A, bisphenol F, phenol novolac, or an alicyclic compound.

The polyester (meth)acrylates (c) may be ester resins containing a polyhydric alcohol and a polybasic acid with a (meth)acrylate added thereto. Examples of the polyhydric alcohol include ethylene glycol, 1,4-butanediol, 1,6-hexanediol, diethylene glycol, trimethylolpropane, dipropylene glycol, polyethylene glycol, polypropylene glycol, pentaerythritol, and dipentaerythritol. Examples of the polybasic acid include phthalic acid, adipic acid, maleic acid, trimellitic acid, itaconic acid, succinic acid, terephthalic acid, and alkenylsuccinic acid.

The polyether (meth)acrylates (d) are polyether resins of a diol with a (meth)acrylate added thereto. Examples of the polyether (meth)acrylates (d) include polyethylene glycol di(meth)acrylate, polypropylene glycol di(meth)acrylate, and polyethylene glycol-polypropylene glycol di(meth)acrylate.

The silicone (meth)acrylates (e) are those obtained by modifying at least one end of dimethyl polysiloxane having a molecular weight of 1000 to 10000 with a (meth)acryloyl group, and examples thereof include compounds represented by the following formula (D24), (D25), or (D26).

[Chem. 4]

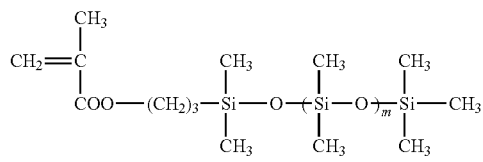

(D24)

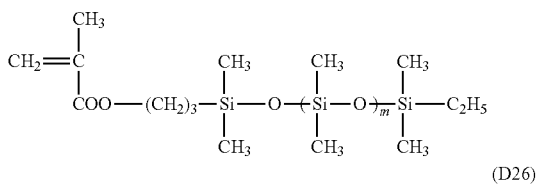

(D25)

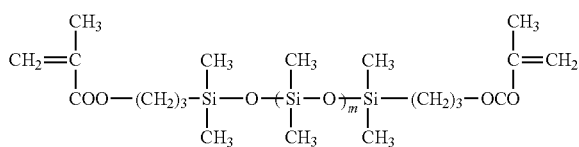

(D26)

The (meth)acrylate monomers (f) are monofunctional or multifunctional alkyl (meth)acrylates or polyether (meth)acrylates having a low viscosity of 500 mPa·s or lower (25° C.). Examples of the (meth)acrylate monomers (f) include methyl (meth)acrylate, ethyl (meth)acrylate, n-propyl (meth)acrylate, isopropyl (meth)acrylate, n-butyl (meth)acrylate, isobutyl (meth)acrylate, sec-butyl (meth)acrylate, t-butyl (meth)acrylate, n-pentyl (meth)acrylate, 3-methylbutyl (meth)acrylate, n-hexyl (meth)acrylate, 2-ethyl-n-hexyl (meth)acrylate, n-octyl (meth)acrylate, cyclohexyl (meth)acrylate, isobornyl (meth)acrylate, benzyl (meth)acrylate, 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentyl glycol mono(meth)acrylate, 3-chloro-2-hydroxypropyl (meth)acrylate, (1,1-dimethyl-3-oxobutyl) (meth)acrylate, 2-acetoacetoxyethyl (meth)acrylate, 2-methoxyethyl (meth)acrylate, 2-ethoxyethyl (meth)acrylate, neopentyl glycol mono(meth)acrylate, 3-chloro-2-hydroxypropyl (meth)acrylate, glycerol mono(meth)acrylate, ethylene glycol diacrylate, propylene glycol diacrylate, 1,6-hexanediol diacrylate, 1,9-nonanediol diacrylate, 1,10-decanediol diacrylate, trimethylolpropane triacrylate, and pentaerythritol tetraacrylate.

Examples of the epoxy monomers (g) include epoxy monomers, including glycidyl ethers of phenols such as bisphenol A, bisphenol F, resorcinol, phenol novolac, and cresol novolac; glycidyl ethers of alcohols such as butanediol, polyethylene glycol, and polypropylene glycol; and glycidyl esters of carboxylic acids such as phthalic acid, isophthalic acid, and tetrahydrophthalic acid, oligomers thereof, and alicyclic epoxides thereof. Preferred among these are monomers or oligomers of bisphenol A glycidyl ether. Specific examples thereof include "Epikote 828" (molecular weight 380), "Epikote 834" (molecular weight 470), "Epikote 1001" (molecular weight 900), "Epikote 1002" (molecular weight 1060), "Epikote 1055" (molecular weight 1350), and "Epikote 1007" (molecular weight 2900) (Mitsubishi Chemical Corp.).

Examples of the vinyl ether monomers (h) include 2-hydroxyethyl vinyl ether, 4-hydroxybutyl vinyl ether, cyclohexanediol monovinyl ether, cis-1,1,3-trimethyl-5-vinyloxycyclohexane, trans-1,1,3-trimethyl-5-vinyloxycyclohexane, 1-isopropyl-4-methyl-2-vinyloxycyclohexane, 2-vinyloxy-7-oxabicyclo[3.2.1]octan-6-one, 2-methyl-2-vinyloxyadamantane, 2-ethyl-2-vinyloxyadamantane, 1,3-bis(vinyloxy)adamantane, 1-vinyloxyadamantanol, 3-vinyloxy-1-adamantanol, 1,3,5-tris(vinyloxy)adamantane, 3,5-bis(vinyloxy)-1-adamantanol, 5-vinyloxy-1,3-adamantanediol, 1,3,5,7-tetrakis(vinyloxy)adamantane, 3,5,7-tris(vinyloxy)-1-adamantanol, 5,7-bis(vinyloxy)-1,3-adamantanediol, 7-vinyloxy-1,3,5-adamantanetriol, 1,3-dimethyl-5-vinyloxyadamantane, 1,3-dimethyl-5,7-bis(vinyloxy)adamantane, 3,5-dimethyl-7-vinyloxy-1-adamantanol, 1-carboxy-3-vinyloxyadamantane, 1-amino-3-vinyloxyadamantane, 1-nitro-3-vinyloxyadamantane, 1-sulfo-3-vinyloxyadamantane, 1-t-butyloxycarbonyl-3-vinyloxyadamantane, 4-oxo-1-vinyloxyadamantane, 1-vinyloxy-3-(1-methyl-1-vinyloxyethyl)adamantane, 1-(vinyloxymethyl)adamantane, 1-(1-methyl-1-vinyloxyethyl)adamantane, 1-(1-ethyl-1-vinyloxyethyl)adamantane, 1,3-bis(1-methyl-1-vinyloxyethyl)adamantane, 1-(1-(norbornan-2-yl)-1-vinyloxyethyl) adamantane, 2,5-bis(vinyloxy)norbornane, 2,3-bis(vinyloxy)norbornane, 5-methoxycarbonyl-2-vinyloxynorbornane, 2-(1-(norbornan-2-yl)-1-vinyloxyethyl)norbornane, 2-(vinyloxymethyl)norbornane, 2-(1-methyl-1-vinyloxyethyl)norbornane, 2-(1-methyl-1-vinyloxypentyl)norbornane, 3-hydroxy-4-vinyloxytetracyclo [4.4.0.12,5.17,10]dodecane, 3,4-bis(vinyloxy)tetracyclo[4.4.0.12,5.17,10]dodecane, 3-hydroxy-8-vinyloxytetracyclo[4.4.0.12,5.17,10]dodecane, 3,8-bis(vinyloxy)tetracyclo[4.4.0.12,5.17,10]dodecane, 3-methoxycarbonyl-8-vinyloxytetracyclo[4.4.0.12,5.17,10]dodecane, 3-methoxycarbonyl-9-vinyloxytetracyclo[4.4.0.12,5.17,10]dodecane, 3-(vinyloxymethyl)tetracyclo[4.4.0.12,5.17,10]dodecane, 3-hydroxymethyl-8-vinyloxytetracyclo[4.4.0.12,5.17,10]dodecane, 3-hydroxymethyl-9-vinyloxytetracyclo[4.4.0.12,5.17,10] dodecane, 8-hydroxy-3-(vinyloxymethyl)tetracyclo [4.4.0.12,5.17,10]dodecane, 9-hydroxy-3-(vinyloxymethyl) tetracyclo[4.4.0.12,5.17,10]dodecane, 8-vinyloxy-4-oxatricyclo[5.2.1.02,6]decane-3,5-dione, 4-vinyloxy-11-oxapentacyclo[6.5.1.13,6.02,7.09,13]pentadecane-10,12-dione, α-vinyloxy-γ,γ-dimethyl-γ-butyrolactone, α,γ, γ-trimethyl-α-vinyloxy-γ-butyrolactone, γ,γ-dimethyl-β-methoxycarbonyl-α-vinyloxy-γ-butyrolactone, 8-vinyloxy-4-oxatricyclo[5.2.1.02,6]decan-3-one, 9-vinyloxy-4-oxatricyclo[5.2.1.02,6]decan-3-one, 8,9-bis(vinyloxy)-4-oxatricyclo[5.2.1.02,6]decan-3-one, 4-vinyloxy-2,7-dioxabicyclo[3.3.0]octan-3,6-dione, 5-vinyloxy-3-oxatricyclo[4.2.1.04,8]nonan-2-one, 5-methyl-5-vinyloxy-3-oxatricyclo[4.2.1.04,8]nonan-2-one, 9-methyl-5-vinyloxy-3-oxatricyclo[4.2.1.04,8]nonan-2-one, 6-vinyloxy-3-oxatricyclo[4.3.1.14,8]undecan-2-one, 6,8-bis (vinyloxy)-3-oxatricyclo[4.3.1.14,8]undecan-2-one, 6-hydroxy-8-vinyloxy-3-oxatricyclo[4.3.1.14,8]undecan-2-one, 8-hydroxy-6-vinyloxy-3-oxatricyclo[4.3.1.14,8]undecan-2-one, and isopropenyl ethers corresponding thereto.

Examples of the oxetane monomers (i) include 1,4-bis{[(3-ethyl-3-oxetanyl)methoxy]ethyl}benzene (e.g., "Arone Oxetane® OXT-121", Toagosei Co., Ltd.) and 3-ethyl-3-hydroxymethyloxetane (e.g., "Arone Oxetane OXT-101", Toagosei Co., Ltd.).

The resin 3, when containing an acid generator as a crosslinking catalyst, may contain an acid crosslinker as a crosslinker.

The acid crosslinker is a compound containing an acidic group and a plurality of (e.g., 2 to 10) crosslinkable reactive groups (e.g., a carboxylic acid, a hydroxy group, an amino group, an isocyanate group, a N-methylol group, an alkyl-etherified N-methylol group, and an epoxy group) in one molecule or a polyvalent metal salt of acetic acid. Examples of the acid crosslinker include amino resins, epoxy compounds, oxazoline compounds, and aluminum acetate.

Examples of the amino resins include compounds obtained by hydroxymethylating at least some of amino groups in melamine compounds, guanamine compounds, urea compounds, and the like, and compounds obtained by etherifying at least some of hydroxy groups of these hydroxymethylated compounds with methanol, ethanol, n-butyl alcohol, 2-methyl-1-propanol, or the like. A specific example thereof is hexamethoxymethyl methylol melamine, and known examples thereof include a variety of alkyl-, methylol-, or imino-type amino resins (Nihon Cytec Industries Inc.).

Examples of the epoxy compounds include glycidyl ethers such as bisphenol A epoxy resins, bisphenol F epoxy resins, phenol-novolac epoxy resins, cresol-novolac epoxy resins, trisphenolmethane epoxy resins, and brominated epoxy resins; alicyclic epoxy resins such as 3,4-epoxycyclohexylmethyl-3,4-epoxycyclohexanecarboxylate and bis (2,3-epoxycyclopentyl)ether; glycidyl esters such as diglycidyl hexahydrophthalate, diglycidyl tetrahydrophthalate, and diglycidyl phthalate; glycidylamines such as tetraglycidyl diaminodiphenylmethane and triglycidyl paraaminophenol; and heterocyclic epoxy resins such as triglycidyl isocyanurate.

Examples of the oxazoline compounds include copolymers of polymerizable monomers such as 2-vinyl-2-oxazoline, 2-vinyl-4-methyl-2-oxazoline, 2-vinyl-5-methyl-2-oxazoline, 2-isopropenyl-2-oxazoline, and 2-isopropenyl-4-methyl-2-oxazoline.

The resin 3 may contain an acid crosslinker as a thermal crosslinker. The thermal crosslinker is a crosslinker blended for the purpose of improving the crosslinkability of a film during post-baking. In order to improve the crosslinking density of the thermal crosslinker, the thermal crosslinker may be used in combination with an acid anhydride of an acid such as crotonic acid, itaconic acid, itaconic anhydride, maleic acid, maleic anhydride, fumaric acid, phtahalic anhydride, tetrahydrophthalic anhydride, or cinnamic acid.

Combination use of a crosslinker with a multifunctional thiol such as 1,4-bis(3-mercaptobutyryloxy)butane or pentaerythritol tetrakis(3-mercaptobutyrate) can increase the curing rate of the resin 3. In this case, the amount of the multifunctional thiol is preferably 0.1 to 20 parts by mass, more preferably 1 to 10 parts by mass, relative to 100 parts by mass of the crosslinker.

The die 4 may be one produced by the following method. First, silicon dioxide ($SiO_2$) serving as an insulating material and pure aluminum are successively formed into films on an aluminum substrate (roll like). Next, the resulting pure-aluminum layer is repetitively subjected to anodizing and etching. This can provide a cavity (die 4) of the moth-eye structure. At this time, the uneven structure of the die 4 can be modified by adjusting the duration of the anodizing and the duration of the etching.

The die 4 includes a surface having undergone release treatment using the release agent 5 containing a compound containing a perfluoro(poly)ether group, a hydrolyzable group (e.g., an alkoxy group), and a Si atom. This enables easy removal of the die 4 from the polymer layer 6. Further, this treatment can lead to a low surface free energy of the die 4, and thus the fluorine atoms in the antifouling agent of the resin 3 can efficiently be distributed on the surface (the surface opposite to the substrate 2) of the resin 3 when the substrate 2 is pushed to the die 4 in Process (2). This treatment can also prevent early removal of the fluorine atoms from the surface (the surface opposite to the substrate 2) of the resin 3 before curing of the resin 3. As a result, in the antifouling film 1, the fluorine atoms can efficiently be distributed on the surface (the surface opposite to the substrate 2) of the polymer layer 6.

The compound containing a perfluoro(poly)ether group, a hydrolyzable group, and a Si atom may specifically be at least one compound (perfluoropolyether compound) selected from the group consisting of the compounds represented by the following formulas (1a), (1b), (2a), (2b), (3a), and (3b).

First, the compounds (fluorosilane-containing compounds) represented by the following formulas (1a), (1b), (2a), and (2b) are described below.

—$(OCF_2CF_2CF_2)$—. The repeating unit —$(OC_2F_4)$— may be any of —$(OCF_2CF_2)$— and —$(OCF(CF_3))$—, and is preferably —$(OCF_2CF_2)$—.

The compound containing a perfluoropolyether group can improve the antifouling properties (e.g., water repellency, oil repellency, ease of wiping off fingerprints) of the antifouling film 1.

In the formulas (1a), (1b), (2a), and (2b), d and f are each 0 or 1; e and g are each an integer of 0 to 2; h and j are each 1 or 2; and i and k are each an integer of 2 to 20.

[Chem. 5]

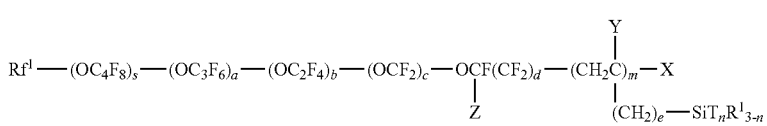

(1a)

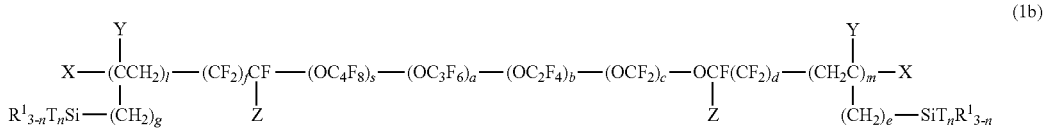

(1b)

[Chem. 6]

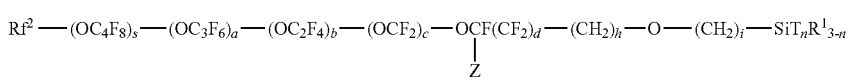

(2a)

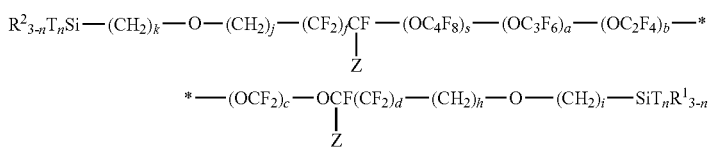

(2b)

In the formulas (1a), (1b), (2a), and (2b), $Rf^1$ and $Rf^2$ are each a C1-C16 (e.g., linear or branched) alkyl group optionally substituted with one or more fluorine atoms, preferably a C1-C3 linear or branched alkyl group optionally substituted with one or more fluorine atoms. The alkyl group optionally substituted with one or more fluorine atoms is preferably a fluoroalkyl group in which the terminal carbon atoms are $CF_2H$— and the other carbon atoms are substituted with a fluorine atom, or a perfluoroalkyl group, more preferably a perfluoroalkyl group, specifically —$CF_3$, —$CF_2CF_3$, or —$CF_2CF_2CF_3$.

In the formulas (1a), (1b), (2a), and (2b), the perfluoropolyether group is a moiety represented by —$(OC_4F_8)_s$—$(OC_3F_6)_a$—$(OC_2F_4)_b$—$(OCF_2)_c$—. In the formula, a, b, c, and s are each the number of the four repeating units of the perfluoropolyether constituting the main backbone of the polymer; a, b, c, and s are each individually an integer of 0 to 200 (e.g., an integer of 1 to 200); the sum of a, b, c, and s is 1 or greater, preferably 20 to 100, more preferably 30 to 50, typically about 40; and the repeating units parenthesized with a, b, c, or s are present in any order in the formulas (1a), (1b), (2a), and (2b). The repeating unit —$(OC_4F_8)$— may be any of —$(OCF_2CF_2CF_2CF_2)$—, —$(OCF(CF_3)CF_2CF_2)$—, —$(OCF_2CF(CF_3)CF_2)$—, —$(OCF_2CF_2CF(CF_3))$—, —$(OC(CF_3)_2CF_2)$—, —$(OCF_2C(CF_3)_2)$—, and —$(OCF(CF_3)CF(CF_3))$—, and is preferably —$(OCF_2CF_2CF_2CF_2)$—. The repeating unit —$(OC_3F_6)$— may be any of —$(OCF_2CF_2CF_2)$—, —$(OCF(CF_3)CF_2)$—, and —$(OCF_2CF(CF_3))$—, and is preferably In the formulas (1a), (1b), (2a), and (2b), X is a hydrogen atom or a halogen atom. The halogen atom is preferably an iodine atom, a chlorine atom, or a fluorine atom, still more preferably an iodine atom.

In the formulas (1a), (1b), (2a), and (2b), Y is a hydrogen atom or a lower alkyl group. The lower alkyl group is preferably a C1-C20 alkyl group.

In the formulas (1a), (1b), (2a), and (2b), Z is a fluorine atom or a lower fluoroalkyl group. The lower fluoroalkyl group may be a C1-C3 fluoroalkyl group, and is preferably a C1-C3 perfluoroalkyl group, more preferably a trifluoromethyl group or a pentafluoroethyl group, still more preferably a trifluoromethyl group.

The formulas (1a), (1b), (2a), and (2b) are preferably, but not limited to, such that $Rf^1$ and $Rf^2$ are each a C1-C3 perfluoroalkyl group, b=0, c=0, d=1, f=1, and Z is a fluorine atom. Such a structure can improve the rubbing resistance. More preferably, the repeating unit parenthesized with a, i.e., —$(OC_3F_6)$—, is —$(OCF_2CF_2CF_2)$— and a=40. Such a structure contains a linear perfluoropolyether group, and thus can lead to a higher rubbing resistance and is easier to synthesize than branched one.

In the formulas (1a), (1b), (2a), and (2b), $R^1$, $R^2$, and T are Si-binding groups; and n is an integer of 1 to 3.

In the formulas (1a), (1b), (2a), and (2b), $R^1$ and $R^2$ are each a C1-C22 alkyl group, a C1-C22 alkoxy group, or a hydroxy group, preferably a C1-C22 alkyl group or a C1-C22 alkoxy group, more preferably a C1-C3 alkyl group or a C1-C3 alkoxy group. The hydroxy group may be, but is not limited to, one generated by hydrolysis of a hydrolyzable group (e.g., a C1-C22 alkoxy group).

In the formulas (1a), (1b), (2a), and (2b), T is a hydroxy group or a hydrolyzable group.

In the formulas (1a), (1b), (2a), and (2b), m and 1 are each an integer of 1 to 10, preferably an integer of 2 to 6.

The compounds represented by the formulas (1a), (1b), (2a), and (2b) each preferably have a number average molecular weight of $5 \times 10^2$ to $1 \times 10^5$, more preferably 2000 to 30000, still more preferably 3000 to 10000, particularly preferably 3000 to 8000, although not limited thereto. The compound having a number average molecular weight within the above range can lead to high friction durability and makes it easy to perform a treatment on the die 4. Too small a number average molecular weight may cause a failure in giving a sufficiently high friction durability, while too large a number average molecular weight may limit the technique for treatment on the die 4.

An exemplary method for producing the compounds represented by the formulas (1a), (1b), (2a), and (2b) is described below, but the method is not limited thereto.

For the compound represented by one of the formulas (1a) and (1b), at least one compound represented by one of the following formulas (1a-ii) and (1b-ii) is prepared as a material.

[Chem. 7]

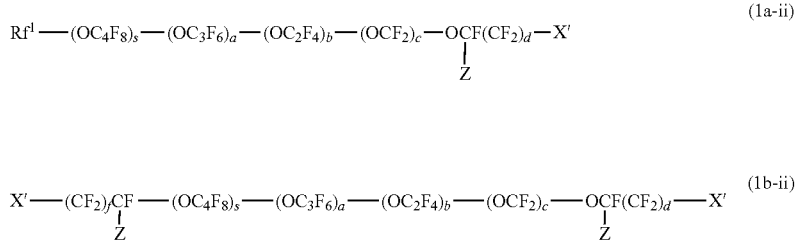

In the formulas (1a-ii) and (1b-ii), X' is a halogen atom, preferably an iodine atom. In the formulas (1a-ii) and (1b-ii), the symbols other than X' are defined in the same manner as in the formulas (1a) and (1b).

The compounds represented by the formulas (1a-ii) and (1b-ii) may be obtained by, but not limited to, halogenating (e.g., iodizing) at least one compound represented by one of the following formulas (1a-i) and (1b-i).

[Chem. 8]

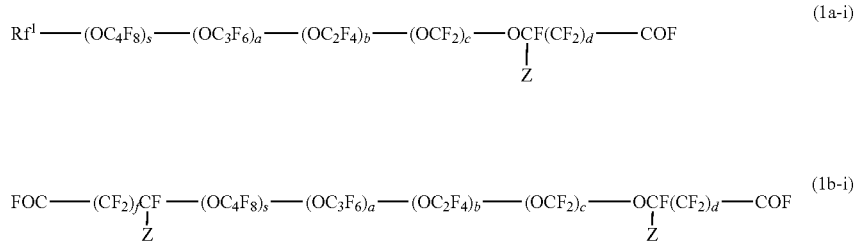

The symbols in the formulas (1a-i) and (1b-i) are defined in the same manner as those in the formulas (1a) and (1b).

Then, the at least one compound represented by one of the formulas (1a-ii) and (1b-ii) is reacted with a compound represented by the following formula (E3) or (E4). Thereby, at least one compound represented by one of the formulas (1a) and (1b) is obtained.

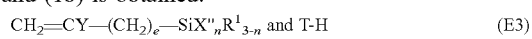   (E3)

   (E4)

In the formulas (E3) and (E4), X" is a halogen atom. In the formulas (E3) and (E4), the symbols other than X" are defined in the same manner as those in the formulas (1a) and (1b).

For the compound represented by one of the formulas (2a) and (2b), at least one compound represented by one of the following formulas (2a-i) and (2b-1) is prepared as a material.

[Chem. 9]

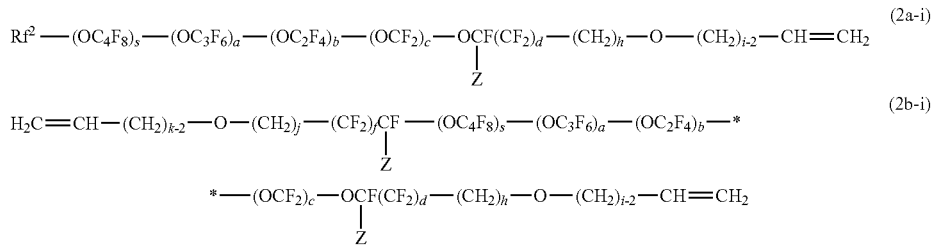

The symbols in the formulas (2a-*i*) and (2b-*i*) are defined in the same manner as those in the formulas (2a) and (2b).

Then, the at least one compound represented by the formula (2a-*i*) or (2b-*i*) is hydrosilylated with a compound represented by the following formula (E5) in the presence of a transition metal (preferably platinum or rhodium).

In the formula (E5), $X^1$ is a halogen atom, preferably a chlorine atom; and the symbols other than $X^1$ are defined in the same manner as in the formulas (2a) and (2b).

Thereby, at least one compound represented by one of the following formulas (2a-ii) and (2b-ii) is obtained.

[Chem. 10]

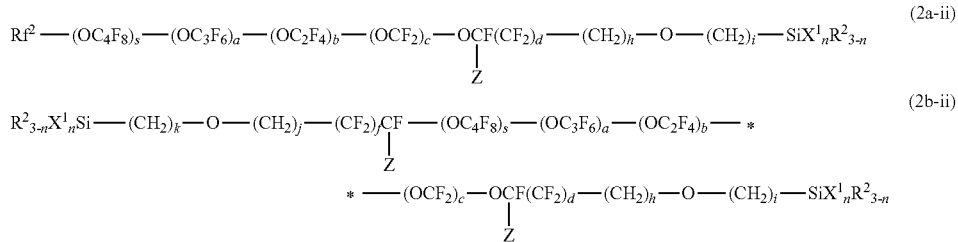

The symbols in the formulas (2a-ii) and (2b-ii) are defined in the same manner as those in the formulas (2a), (2b), and (E5).

Then, the at least one compound represented by one of the formulas (2a-ii) and (2b-ii) is dehalogenated with a compound represented by the following formula (E6). Thereby, at least one compound represented by one of the formulas (2a) and (2b) is obtained.

In the formula (E6), T is defined in the same manner as those in the formulas (2a) and (2b), except for the hydroxy group.

Although the compounds represented by the formulas (1a), (1b), (2a), and (2b) are described hereinabove, these compounds are not limited to those produced by the above methods.

Next, the compounds (fluorosilane-containing compounds) represented by the following formulas (3a) and (3b) are described below.

In the formulas (3a) and (3b), A is a C1-C16 alkyl group optionally substituted with one or more fluorine atoms. The "C1-C16 alkyl group" in the C1-C16 alkyl group optionally substituted with one or more fluorine atoms is a linear or branched C1-C16 alkyl group, preferably a linear or branched C1-C6, particularly C1-C3, alkyl group, more preferably a linear C1-C3 alkyl group.

In the formulas (3a) and (3b), A is preferably a C1-C16 alkyl group substituted with one or more fluorine atoms, more preferably a $CF_2H$—$C_{1-5}$ perfluoroalkylene group, still more preferably a C1-C16 perfluoroalkyl group.

The C1-C16 perfluoroalkyl group is a linear or branched C1-C16 perfluoroalkyl group, preferably a linear or branched C1-C6, particularly C1-C3, perfluoroalkyl group, more preferably a linear C1-C3 perfluoroalkyl group (specifically, —$CF_3$, —$CF_2CF_3$, or —$CF_2CF_2CF_3$).

In the formulas (3a) and (3b), Rf is a group represented by the following formula (E1), which corresponds to a perfluoropolyether group.

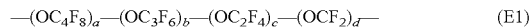

In the formula (E1), a, b, c, and d are each individually an integer of 0 or greater, with the sum of them being 1 or greater; a, b, c, and d are preferably each individually an integer of 0 to 200 (e.g., an integer of 1 to 200), more preferably each individually an integer of 0 to 100 (e.g., an integer of 1 to 100). The sum of a, b, c, and d is still more preferably 10 or greater (preferably 20 or greater) and 200 or smaller (preferably 100 or smaller). The repeating units parenthesized with a, b, c, or d are present in any order in the formula (E1). For these repeating units, —$(OC_4F_8)$— may be any of —$(OCF_2CF_2CF_2CF_2)$—, —$(OCF(CF_3)CF_2CF_2)$—, —$(OCF_2CF(CF_3)CF_2)$—, —$(OCF_2CF_2CF(CF_3))$—, —$(OC(CF_3)_2CF_2)$—, —$(OCF_2C(CF_3)_2)$—, —$(OCF(CF_3)CF(CF_3))$—, —$(OCF(C_2F_5)CF_2)$—, and —$(OCF_2CF(C_2F_5))$—, preferably —$(OCF_2CF_2CF_2CF_2)$—; —$(OC_3F_6)$— may be any of —$(OCF_2CF_2CF_2)$—, —$(OCF(CF_3)CF_2)$—, and —$(OCF_2CF(CF_3))$—, preferably —(OCF$_2$CF$_2$CF$_2$)—; and —(OC$_2$F$_4$)— may be either of —(OCF$_2$CF$_2$)— and —(OCF(CF$_3$))—, preferably —(OCF$_2$CF$_2$)—.

In an embodiment, Rf in the formulas (3a) and (3b) may be a group represented by the following formula (E7), and is preferably a group represented by the following formula (E8).

$$—(OC_3F_6)_b— \qquad (E7)$$

In the formula (E7), b is an integer of 1 to 200, preferably an integer of 10 to 100.

$$—(OCF_2CF_2CF_2)_b— \qquad (E8)$$

In the formula (E8), b is defined in the same manner as b in the formula (E7).

In another embodiment, Rf in the formulas (3a) and (3b) may be a group represented by the following formula (E9), and is preferably a group represented by the following formula (E10).

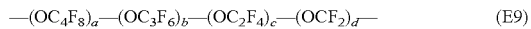
$$—(OC_4F_8)_a—(OC_3F_6)_b—(OC_2F_4)_c—(OCF_2)_d— \qquad (E9)$$

In the formula (E9), a and b are each individually an integer of 0 to 30, preferably an integer of 0 to 10; c and d are each individually an integer of 1 to 200, preferably an integer of 10 to 100; the sum of a, b, c, and d is 10 or greater (preferably 20 or greater) and 200 or smaller (preferably 100 or smaller); and the repeating units parenthesized with a, b, c, or d are present in any order in the formula (E9).

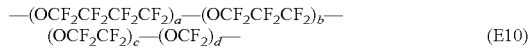
$$—(OCF_2CF_2CF_2CF_2)_a—(OCF_2CF_2CF_2)_b—$$
$$(OCF_2CF_2)_c—(OCF_2)_d— \qquad (E10)$$

In the formula (E10), a, b, c, and d are defined in the same manner as a, b, c, and d in the formula (E9).

In the formulas (3a) and (3b), X is a divalent organic group. In the compounds represented by the formulas (3a) and (3b), X is understood as a linker coupling a perfluoropolyether moiety (A-Rf— moiety or —Rf— moiety) mainly providing water repellency and smoothness and a silane moiety (—SiQ$_k$Y$_{3-k}$ moiety) that is to be hydrolyzed to provide an ability to bind to the die 4. Thus, this X may be any divalent organic group that allows the compounds represented by the formulas (3a) and (3b) to be present stably.

X in the formulas (3a) and (3b) may be, but is not limited to, a group represented by the following formula (E11):

$$—(R^6)_p—(X^1)_q—R^7— \qquad (E11)$$

wherein R$^6$ is —(CH$_2$)$_s$— or an o-, m-, or p-phenylene group, preferably —(CH$_2$)$_s$—; R$^7$ is —(CH$_2$)$_t$— or an o-, m-, or p-phenylene group, preferably —(CH$_2$)$_t$—; X$^1$ is —(X$^2$)$_r$—; X$^2$s are each individually —O—, —S—, an o-, m-, or p-phenylene group, —C(O)O—, —CONR$^5$—, —O—CONR$^5$—, —NR$^5$—, —Si(R$^3$)$_2$—, —(Si(R$^3$)$_2$O)$_n$—Si(R$^3$)$_2$—, or —(CH$_2$)$_v$—; R$^3$s are each individually a phenyl group or a C1-C6 alkyl group, preferably a C1-C6 alkyl group, more preferably a methyl group; R$^5$s are each individually a hydrogen atom, a phenyl group, or a C1-C6 alkyl group (preferably a methyl group); each m is individually an integer of 1 to 100, preferably an integer of 1 to 20; each v is individually an integer of 1 to 20, preferably an integer of 1 to 6, more preferably an integer of 1 to 3; s is an integer of 1 to 20, preferably an integer of 1 to 6, more preferably an integer of 1 to 3, still more preferably 1 or 2; t is an integer of 1 to 20, preferably an integer of 2 to 6, more preferably an integer of 2 or 3; r is an integer of 1 to 10, preferably an integer of 1 to 5, more preferably an integer of 1 to 3; p is 0 or 1; and q is 0 or 1.

In the formulas (3a) and (3b), X is preferably a C1-C20 alkylene group, a group represented by the following formula (E12), or a group represented by the following formula (E13), more preferably a C1-C20 alkylene group, a group represented by the following formula (E14), or a group represented by the following formula (E15).

$$—R^6—X^3—R^7— \qquad (E12)$$

$$—X^4—R^7— \qquad (E13)$$

In the formulas (E12) and (E13), R$^6$ and R$^7$ are defined in the same manner as R$^6$ and R$^7$ in the formula (E11).

$$—(CH_2)_s—X^3—(CH_2)_t— \qquad (E14)$$

$$—X^4—(CH_2)_t— \qquad (E15)$$

In the formulas (E14) and (E15), s and t are defined in the same manner as s and t in the formula (E11).

In the formulas (E12) and (E14), X$^3$ is —O—, —S—, —C(O)O—, —CONR$^5$—, —O—CONR$^5$—, —Si(R$^3$)$_2$—, —(Si(R$^3$)$_2$O)$_m$—Si(R$^3$)$_2$—, —O—(CH$_2$)$_u$—(Si(R$^3$)$_2$O)$_m$—Si(R$^3$)$_2$—, —CONR$^5$—(CH$_2$)$_u$—(Si(R$^3$)$_2$O)$_m$—Si(R$^3$)$_2$—, —CONR$^5$—(CH$_2$)$_v$—N(R$^5$)—, or —CONR$^5$— (o-, m-, or p-phenylene)-Si(R$^3$)$_2$—, wherein R$^3$, R$^5$, m, and v are defined in the same manner as R$^3$, R$^5$, m, and v in the formula (E11); and u is an integer of 1 to 20, preferably an integer of 2 to 6, more preferably an integer of 2 or 3. X$^3$ is preferably —O—.

In the formulas (E13) and (E15), X$^4$ is —S—, —C(O)O—, —CONR$^5$—, —CONR$^5$—(CH$_2$)$_u$—(Si(R$^3$)$_2$O)$_m$—Si(R$^3$)$_2$—, —CONR$^5$—(CH$_2$)$_v$—N(R$^5$)—, or —CONR$^5$-(o-, m-, or p-phenylene)-Si(R$^3$)$_2$—, wherein R$^3$, R$^5$, m, and v are defined in the same manner as R$^3$, R$^5$, m, and v in the formula (E11); and u is an integer of 1 to 20, preferably an integer of 2 to 6, more preferably an integer of 2 or 3.

In the formulas (3a) and (3b), X is still more preferably a C1-C20 alkylene group, a group represented by the following formula (E16), a group represented by the following formula (E17), or a group represented by the following formula (E18).

$$—(CH_2)_s—O—(CH_2)_t— \qquad (E16)$$

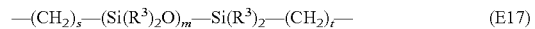
$$—(CH_2)_s—(Si(R^3)_2O)_m—Si(R^3)_2—(CH_2)_t— \qquad (E17)$$

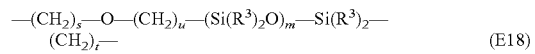
$$—(CH_2)_s—O—(CH_2)_u—(Si(R^3)_2O)_m—Si(R^3)_2—$$
$$(CH_2)_t— \qquad (E18)$$

The symbols in the formulas (E16), (E17), and (E18) are defined in the same manner as the symbols in the formulas (E12), (E13), (E14), and (E15).

In the formulas (3a) and (3b), X may be substituted with at least one substituent selected from the group consisting of a fluorine atom, a C1-C3 alkyl group, and a C1-C3 fluoroalkyl group (preferably, a C1-C3 perfluoroalkyl group).

In the formulas (3a) and (3b), Y is a hydroxy group, a hydrolyzable group, or a hydrocarbon group. The hydroxy group may be, but is not limited to, one generated by hydrolysis of a hydrolyzable group (e.g., a C1-C22 alkoxy group).

In the formulas (3a) and (3b), Y is preferably a hydroxy group, a C1-C12 alkyl group, a C2-C12 alkenyl group, a C2-C12 alkynyl group, a phenyl group, or a group represented by the following formula (E19), more preferably —OCH$_3$, —OCH$_2$CH$_3$, or —OCH(CH$_3$)$_2$. These groups may be substituted with at least one substituent selected from the group consisting of a fluorine atom, a C1-C6 alkyl group, a C2-C6 alkenyl group, and a C2-C6 alkynyl group.

$$—O(R^5) \qquad (E19)$$

In the formula (E19), $R^5$ is a C1-C12 alkyl group, preferably a C1-C6 alkyl group, more preferably a C1-C3 alkyl group.

In the formulas (3a) and (3b), Q is a group represented by the following formula (E2).

$$-Z-SiR^1{}_nR^2{}_{3-n} \qquad (E2)$$

In the formula (E2), Zs are each individually a divalent organic group.

In the formula (E2), Z preferably contains no moiety that is to form a siloxane bond with a Si atom at an end of the molecular main chain in the formula (3a) or (3b).

In the formula (E2), Z is preferably a C1-C6 alkylene group, a group represented by the following formula (E20), or a group represented by the following formula (E21), more preferably a C1-C3 alkylene group. These groups may be substituted with at least one substituent selected from the group consisting of a fluorine atom, a C1-C6 alkyl group, a C2-C6 alkenyl group, and a C2-C6 alkynyl group.

$$-(CH_2)_{s'}-O-(CH_2)_{t'}- \qquad (E20)$$

In the formula (E20), s' is an integer of 1 to 6; and t' is an integer of 1 to 6.

$$\text{-phenylene-}(CH_2)_{u'}- \qquad (E21)$$

In the formula (E21), u' is an integer of 0 to 6.

In the formula (E2), $R^1$s are each individually a hydroxy group or a hydrolyzable group.

In the formula (E2), $R^1$ is preferably a group represented by the following formula (E22).

$$-OR^6 \qquad (E22)$$

In the formula (E22), $R^6$ is a substituted or non-substituted C1-C3 alkyl group, preferably a methyl group.

In the formula (E2), $R^2$s are each individually a C1-C22 alkyl group or Q'. Q' is defined in the same manner as Q in the formulas (3a) and (3b).

In the formula (E2), each n is individually an integer of 0 to 3 and the sum of them is 1 or greater for each of Q and Q'. When n is 0 in Q or Q', Si in Q or Q' contains neither a hydroxy group nor a hydrolyzable group. Thus, the sum of ns must be 1 or greater.

In the formula (E2), n is preferably 2, more preferably 3, in Q' at an end of the -Q-Q'$_{0-5}$ chain that binds to a Si atom at an end of the molecular main chain of the perfluoropolyether group.

When at least one $R^2$ is Q', there are two or more Si atoms linearly linked via Z in Q represented by the formula (E2). The number of Si atoms linearly linked via Z in Q is at most five. The "number of Si atoms linearly linked via Z in Q" is equivalent to the number of repeated —Z—Si-units linearly linked.

An example of the linking structure of Si atoms via Z in Q is shown in the following formula (E23).

[Chem. 11]

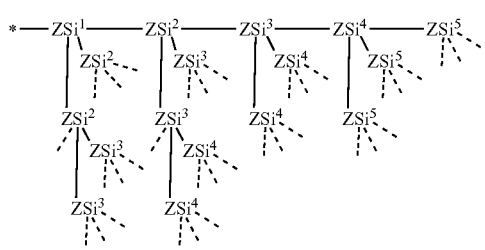

(E23)

In the formula (E23), the symbol "*" represents the site binding to Si in the main chain. The symbol "---" represents binding of a predetermined group other than ZSi. In other words, when all of the three bindings of a Si atom are represented by the symbol "---", it means the site where repeat of ZSi is finished. The superscript immediately after Si is the number of Si atoms linearly linked from the symbol "*" via Z. In other words, when the ZSi repeating is finished at Si$^t$, the chain is considered as including two "Si atoms linearly linked via Z in Q". Similarly, when ZSi repeating is finished at Si$^3$, Si$^4$, and Si$^5$, the chain includes three, four, and five "Si atoms linearly linked via Z in Q", respectively. As is clear from the above formula (E23), a plurality of ZSi chains is present in Q. Still, they need not to have the same length, and may have the respective lengths.

As shown in the following formulas (E24) and (E25), the "number of Si atoms linearly linked via Z in Q" is preferably one (formula (E24)) or two (formula (E25)) in all the chains.

[Chem. 12]

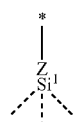

(E24)

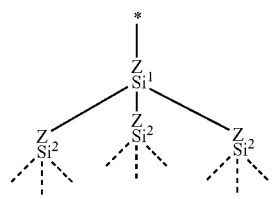

(E25)

In an embodiment, "the number of Si atoms linearly linked via Z in Q" may be one (in other words, only one Si atom is present in Q) or two, and is preferably one.

In the formulas (3a) and (3b), k is an integer of 1 to 3, preferably an integer of 2 or 3, more preferably 3. When k is 3, the release agent can firmly bind to the die 4, achieving high friction durability.

In an embodiment, in the compounds represented by the formulas (3a) and (3b), $R^2$ in Q represented by the formula (E2) may be a C1-C22 alkyl group.

In another embodiment, in the compounds represented by the formulas (3a) and (3b), at least one $R^2$ in Q represented by the formula (E2) may be Q'.

In the compounds represented by the formulas (3a) and (3b), the "A-Rf—" moiety preferably has a number average molecular weight of 500 to 30000, more preferably 1500 to 10000, still more preferably 3000 to 8000, although not limited thereto.

In order to achieve high friction durability, the number average molecular weight of the compounds represented by the formulas (3a) and (3b) is preferably, but not limited to, $5 \times 10^2$ to $1 \times 10^5$, more preferably 1500 to 30000, still more preferably 2500 to 10000, particularly preferably 3000 to 8000.

An exemplary method for producing the compounds represented by the formulas (3a) and (3b) is described below, but the method is not limited thereto.

For the compound represented by the formula (3a) or (3b), a compound represented by the following formula (3a-1) or (3b-1) is prepared.

$$A\text{-}Rf\text{--}X'\text{--}CH\text{=}CH_2 \quad (3a\text{-}1)$$

$$CH_2\text{=}CH\text{--}X'\text{--}Rf\text{--}X'\text{--}CH\text{=}CH_2 \quad (3b\text{-}1)$$

In the formulas (3a-1) and (3b-1), A and Rf are defined in the same manner as A and Rf in the formulas (3a) and (3b); and X' is a divalent organic group.

Then, the compound represented by the formula (3a-1) or (3b-1) is reacted with a compound represented by the following formula (E26):

$$HSiM_3 \quad (E26)$$

wherein Ms are each individually a halogen atom or a C1-C6 alkoxy group.

Thereby, a compound represented by the following formula (3a-2) or (3b-2) is obtained.

$$A\text{-}Rf\text{--}X'\text{--}CH_2\text{--}CH_2\text{-}SiM_3 \quad (3a\text{-}2)$$

$$M_3Si\text{--}CH_2\text{--}CH_2\text{--}X'\text{--}Rf\text{--}X'\text{--}CH_2\text{--}CH_2\text{-}SiM_3 \quad (3b\text{-}2)$$

In the formulas (3a-2) and (3b-2), A and Rf are defined in the same manner as A and Rf in the formulas (3a) and (3b); X' is defined in the same manner as X' in the formulas (3a-1) and (3b-1); and M is defined in the same manner as M in the formula (E26).

Then, the compound represented by the formula (3a-2) or (3b-2) is reacted with a compound represented by the following formula (E27) and, if necessary, a compound represented by the following formula (E28).

$$Hal\text{-}J\text{-}Z'\text{--}CH\text{=}CH_2 \quad (E27)$$

In the formula (E27), Z' is a bond or a divalent linker group; J is Mg, Cu, Pd, or Zn; and Hal is a halogen atom.

$$Y_hL \quad (E28)$$

In the formula (E28), Y is defined in the same manner as Y in the formulas (3a) and (3b); L is a group capable of binding to Y; and h is an integer of 1 to 3.

Thereby, a compound represented by the following formula (3a-3) or (3b-3) is obtained.

$$A\text{-}Rf\text{--}X'\text{--}CH_2\text{--}CH_2\text{--}Si(Y_{3-k'})(\text{--}Z'\text{--}CH\text{=}CH_2)_{k'} \quad (3a\text{-}3)$$

$$(CH_2\text{=}CH\text{--}Z'\text{--})_{k'}(Y_{3-k'})Si\text{--}CH_2\text{--}CH_2\text{--}X'\text{--}Rf\text{--}**X'\text{--}CH_2\text{--}CH_2\text{--}Si(Y_{3-k'})(\text{--}Z'\text{--}CH\text{=}CH_2)_{k'} \quad (3b\text{-}3)$$

In the formulas (3a-3) and (3b-3), A, Rf, and Y are defined in the same manner as A, Rf, and Y in the formulas (3a) and (3b); X' is defined in the same manner as X' in the formulas (3a-1) and (3b-1); Z' is defined in the same manner as Z' in the formula (E27); and k' is an integer of 1 to 3.

Then, the compound represented by the formula (3a-3) or (3b-3) is reacted with the compound represented by the formula (E26) and, if necessary, at least one selected from a compound represented by the following formula (E29) and a compound represented by the following formula (E30). Thereby, a compound represented by the formula (3a) or (3b) is obtained.

$$R^1_iL' \quad (E29)$$

In the formula (E29), $R^1$ is defined in the same manner as $R^1$ in the formula (E2); L' is a group capable of binding to $R^1$; and i is an integer of 1 to 3.

$$R^{2'}_jL'' \quad (E30)$$

In the formula (E30), $R^{2'}$ is a C1-C22 alkyl group; L'' is a group capable of binding to $R^{2'}$; and j is an integer of 1 to 3.

Known examples of at least one compound (perfluoropolyether compound) selected from the group consisting of the compounds represented by the formulas (1a), (1b), (2a), (2b), (3a), and (3b) include "Optool DSX", "Optool DSX-E", and "Optool UD100" (Daikin Industries, Ltd.) and "KY-164" and "KY-108" (Shin-Etsu Chemical Co., Ltd.).

The release agent 5 may contain a perfluoroalkyl compound in addition to at least one compound (perfluoropolyether compound) selected from the group consisting of the compounds represented by the formulas (1a), (1b), (2a), (2b), (3a), and (3b).

Examples of the perfluoroalkyl compound include $C_8F_{17}CH_2CH_2Si(OMe)_3$, $C_6F_{13}CH_2CH_2Si(OMe)_3$, and $C_4F_9CH_2CH_2Si(OMe)_3$.

The thickness Q of the polymer layer 6 is preferably 1 μm or greater and 20 μm or smaller, more preferably 3 μm or greater and 10 μm or smaller. If the die 4 has local deformation or foreign substances other than the desired uneven structure, the polymer layer 6 having a thickness Q of smaller than 1 μm may cause easy sighting of defects (e.g., deformation transferred from the die 4, foreign substances) of the antifouling film 1. The polymer layer 6 having a thickness Q of greater than 20 μm may cause defects such as curling of the antifouling film 1 due to curing and shrinkage of the resin 3. As shown in FIG. 1(d), the thickness Q of the polymer layer 6 means the distance from the surface close to the substrate 2 to the apex of a projection 7.

Examples of the shape of the projections 7 include those tapering toward the tip (a tapered shape) such as shapes consisting of a columnar lower part and a hemispherical upper part (temple-bell-like shapes) and conical shapes (cone-like shapes, circular-cone-like shapes). In FIG. 1(d), the bases of the gaps between any adjacent projections 7 are inclined, but the bases may not be inclined but may be flat.

The pitch P between adjacent projections 7 may be any value that is not longer than the wavelength of visible light (780 nm), and is preferably 20 nm or greater and 400 nm or smaller, more preferably 50 nm or greater and 300 nm or smaller. Adjacent projections 7 with a pitch P of smaller than 20 nm may have insufficient mechanical strength, causing poor rubbing resistance of the antifouling film 1. Adjacent projections 7 with a pitch P of greater than 400 nm may cause occurrence of undesirable appearance of the antifouling film 1 due to unnecessary phenomena such as diffraction and scattering caused by the uneven structure. The pitch between adjacent projections as used herein can be determined as an average value of distances of any adjacent projections (distances between the apexes thereof) in a 2D picture taken with a scanning electron microscope. For example, a 2D picture (magnification: 20000×) of the uneven structure is first taken using a scanning electron microscope. For about 200 projections within an area of several square micrometers of the picture, a combination of three projections is selected which shows the shortest distance between the adjacent projections. Then, the distances between any two of the three projections are measured and the average value thereof is calculated. Thereby, the pitch between adjacent projections (average distance between adjacent projections) is determined.

Each projection 7 preferably has a height of 50 nm or greater and 500 nm or smaller, more preferably 100 nm or greater and 400 nm or smaller. Projections 7 having a height of smaller than 50 nm may cause insufficient antireflective performance of the antifouling film 1. Projections 7 having a height of greater than 500 nm may have insufficient mechanical strength, causing poor rubbing resistance of the antifouling film 1.

Each projection 7 preferably has an aspect ratio of 0.13 or greater and 25 or smaller, more preferably 0.3 or greater and 8 or smaller. The aspect ratio of a projection as used herein means the ratio of the height of the projection of interest and the pitch between adjacent projections (height/pitch). A preferred aspect ratio of the projection 7 is determined by a preferred range of the pitch P between adjacent projections 7 and a preferred range of the height of the projection 7 in consideration of the mechanical strength (rubbing resistance) and the optical performance (antireflective performance and performance of preventing unnecessary phenomena such as diffraction and scattering).

The projections 7 may be arranged either randomly or regularly (periodically). The projections 7 may be arranged with periodicity. Still, in order to successfully avoid unnecessary diffraction of light due to such periodicity, the projections 7 are preferably arranged without periodicity (arranged randomly).

Consequently, in the method for producing an antifouling film of the embodiment, the resin 3 used contains an antifouling agent that contains a compound containing a perfluoro(poly)ether group and the release agent 5 used contains a compound that contains a perfluoro(poly)ether group, a hydrolyzable group, and a Si atom. This can lead to high affinity therebetween. As a result, the antifouling agent in the resin 3 can be efficiently bled out, enabling production of the antifouling film 1 having excellent antifouling properties and rubbing resistance. The antifouling film 1 has excellent antifouling properties, and thus dirt sticking thereto can be wiped off with a dry cloth. Further, the antifouling film 1 has excellent rubbing resistance, and thus the shape of the uneven structure is not collapsed even when strongly rubbed with a tissue, for example. In addition, the antifouling film 1 does not suffer mutual sticking of projections, and thus the projections 7 can be tall, achieving ultra-low reflectivity.

Hereinafter, the present invention is described in more detail based on examples and comparative examples. The examples, however, are not intended to limit the scope of the present invention.

[Evaluation 1: Evaluation Based on Type of Antifouling Agent]

The antifouling films were evaluated while the type of the antifouling agent was changed.

The materials used for producing the antifouling films were as follows.

(Substrate 2)

"Fujitac® TD-60" from Fujifilm Corp. was used. The thickness thereof was 60 μm.

(Resin 3)

Resins A1 to A5, a1, and a2 having the respective compositions shown in Table 1 were used. The abbreviations of the materials of the respective resins are as follows. Table 1 also indicates the amount of the active component of the antifouling agent in each resin.

<Antifouling Agent>

The following four compounds were used as the antifouling agents.

(1) "Antifouling Agent A"

The antifouling agent A was produced by the following method, and contained a perfluoropolyether compound. First, in a reactor, 57 g of "Sumidur N3300" (Sumika Bayer Urethane Co., Ltd., cyclic trimer of hexamethylene diisocyanate, NCO content: 21.9%) was dissolved in 1000 g of "Zeorora® H" (Zeon Corp.), and 0.1 g of dibutyltin dilaurate (1st Grade, Wako Pure Chemical Industries, Ltd.) was added thereto. To the mixture was dropwise added a solution of 244 g of "$CF_3CF_2O$—$(CF_2CF_2CF_2O)_{11}$—$CF_2CF_2CH_2OH$" dissolved in 300 g of "Zeorora H" (Zeon Corp.) under stirring at room temperature. This mixture was continuously stirred at room temperature overnight. The mixture was then warmed, and 24.4 g of hydroxyethyl acrylate was dropwise added thereto and the mixture was stirred. The reaction end point was defined as the point at which the NCO absorption completely disappeared in IR. Thereby, the antifouling agent A was obtained. The antifouling agent A contained 20 wt % of the active component.

(2) "Antifouling Agent B"

The antifouling agent B was produced by the following method, and contained a perfluoropolyether compound. First, 1300 g of 4-acryloylmorpholine was added to the antifouling agent A produced by the aforementioned method. While the mixture was warmed under reduced pressure, "Zeorora H" (Zeon Corp.) was distilled off. Then, $^{19}$F-NMR was performed to confirm that the peak of "Zeorora H" (Zeon Corp.) was below the detection limit. Thereby, the antifouling agent B was obtained. The antifouling agent B contained 20 wt % of the active component.

(3) "Antifouling Agent C"

The antifouling agent C was produced in the same manner as the antifouling agent B, except that the amount of 4-acryloylmorpholine was changed to 650 g, and contained a perfluoropolyether compound. The antifouling agent C contained 40 wt % of the active component.

(4) "Antifouling Agent D"

"Cheminox® FAAC-6" (Unimatec Co., Ltd.)

The antifouling agent D was a perfluoroalkyl compound.

<Monomer>

"ATM": "ATM-35E" (Shin Nakamura Chemical Co., Ltd.)

"TMM": "A-TMM-3LM-N" (Shin Nakamura Chemical Co., Ltd.)

"AC": "ACMO" (KJ Chemicals Corp.)

<Polymerization Initiator>

"TPO": "IRGACURE TPO" (BASF SE)

TABLE 1

| | | Material name | Resin | | | | | | |
|---|---|---|---|---|---|---|---|---|---|
| Type | | | A1 | A2 | A3 | A4 | A5 | a1 | a2 |
| Composition (wt %) | Antifouling agent | A | — | — | — | 25 | — | — | — |
| | | B | 5 | 10 | 25 | — | — | — | — |
| | | C | — | — | — | — | 12.5 | — | — |
| | | D | — | — | — | — | — | — | 5 |
| | Monomer | ATM | 44 | 43 | 35 | 35 | 45 | 45 | 44 |
| | | TMM | 28.5 | 28.5 | 21.5 | 18.5 | 23.5 | 28.5 | 28.5 |
| | | AC | 21 | 17 | 17 | 20 | 17.5 | 25 | 21 |
| | Polymerization initiator | TPO | 1.5 | 1.5 | 1.5 | 1.5 | 1.5 | 1.5 | 1.5 |

TABLE 1-continued

| | Material | Resin | | | | | | |
|---|---|---|---|---|---|---|---|---|
| Type | name | A1 | A2 | A3 | A4 | A5 | a1 | a2 |
| Amount of active component of antifouling agent in resin (wt %) | | 1 | 2 | 5 | 5 | 5 | 0 | 5 |

(Die 4)

A die produced by the following method was used. First, a film of aluminum that is a material of the die 4 was formed on a surface of a 10-cm-square glass substrate by sputtering. The thickness of the resulting aluminum layer was 1.0 µm. Next, the resulting aluminum layer was repetitively subjected to anodizing and etching (immediately after the anodizing). Thereby, an anodizing layer was formed with many fine pores (distance between the bottom points of adjacent pores (recesses) was not longer than the wavelength of visible light). Specifically, anodizing, etching, anodizing, etching, anodizing, etching, anodizing, etching, and anodizing were performed successively (anodizing: 5 times, etching: 4 times), so that a die 4 having an uneven structure was obtained. Fine pores (recesses) formed by such alternate repeating of anodizing and etching each taper toward the inside of the aluminum layer (having a tapered shape). The anodizing was performed using oxalic acid (concentration: 0.6 wt %) at a liquid temperature of 5° C. and an applied voltage of 80 V. The duration of a single anodizing process was 20 seconds. The etching was performed using phosphoric acid (concentration: 1 mol/l) at a liquid temperature of 30° C. The duration of a single etching process was 25 minutes. The die 4 was found to have a pitch between adjacent recesses (distance between the bottom points) of about 180 nm and a recess depth of about 180 nm by scanning electron microscopic observation. Each recess had a conical shape.

(Release Agent 5)

"Release agent A": "Optool DSX" (Daikin Industries, Ltd.)

Example 1

An antifouling film of Example 1 was produced by the method for producing an antifouling film of the embodiment.

(a) Application of Resin (Process (1))

The resin 3 was applied to a surface of the substrate 2 using a bar coater. The resin 3 used was the aforementioned resin A1, and the thickness thereof was 7 µm.

Separately, the die 4 was prepared. A surface of the die 4 was coated with the release agent 5 and had undergone release treatment. Specifically, first, a dilution of the release agent 5 in "S-135" (Fluoro Technology Co., Ltd.) was prepared. The concentration of the release agent 5 in the dilution was 0.1%. Next, the surface of the die 4 was subjected to $O_2$ asking at 200 W for 20 minutes. Then, the die 4 was immersed in the dilution of the release agent 5 for three minutes, so that the surface of the die 4 was coated with the release agent 5. The die 4 with the surface coated with the release agent 5 was annealed at 100° C. for one hour, and then rinsed with "S-135" (Fluoro Technology Co., Ltd.) for three minutes.

(b) Formation of Uneven Structure (Process (2))

The substrate 2 was pushed to the die 4 with the resin 3 in between. Thereby, the uneven structure was formed on the surface (the surface opposite to the substrate 2) of the resin 3.

(c) Curing of Resin (Process (3))

The resin 3 having the uneven structure on the surface thereof was irradiated with and cured by ultraviolet rays (dose: 1 J/cm$^2$) from the substrate 2 side using a UV lamp "Light Hanmar 6J6P3" (Heraeus Holding), so that the polymer layer 6 was formed. The thickness Q of the polymer layer 6 was 7 µm.

(d) Release of Die

The die 4 was released from the polymer layer 6. Thereby, the antifouling film 1 was completed. The surface specifications of the antifouling film 1 were as follows. The surface specifications of the antifouling film 1 were evaluated using a scanning electron microscope "S-4700" (Hitachi High-Technologies Corp.). For the evaluation, osmium(VIII) oxide (thickness: 5 nm, Wako Pure Chemical Industries, Ltd.) was applied to the surface opposite to the substrate 2 of the polymer layer 6 using an osmium coater "NEOC-ST" (Meiwafosis Co., Ltd.).

Shape of projections 7: temple-bell-like shape
Pitch P between adjacent projections 7: about 180 nm
Height of projections 7: about 180 nm
Aspect ratio of projections 7: 1.0

Examples 2 to 5 and Comparative Examples 1 and 2

An antifouling film of each example was produced in the same manner as in Example 1, except that the composition was changed as shown in Table 2.

(Evaluation Contents and Evaluation Results)

For the antifouling films of Examples 1 to 5 and Comparative Examples 1 and 2, the antifouling properties, the rubbing resistance, and the adhesion between the substrate and the polymer layer (hereinafter, also simply referred to as adhesion) were evaluated. The results are shown in Table 2.

<Antifouling Properties>

For the antifouling properties, the water repellency and the oil repellency were evaluated.

The water repellency was evaluated by the contact angle of water on the surface (the surface opposite to the substrate of the polymer layer) of the antifouling film of each example. Specifically, water was dropped on the surface (the surface opposite to the substrate of the polymer layer) of the antifouling film of each example, and the contact angle thereof was measured immediately after the dropping.

The oil repellency was evaluated by the contact angle of hexadecane on the surface (the surface opposite to the substrate of the polymer layer) of the antifouling film of each example. Specifically, hexadecane was dropped on the surface (the surface opposite to the substrate of the polymer layer) of the antifouling film of each example, and the contact angle thereof was measured immediately after the dropping and 10 seconds thereafter.

The contact angles of water and hexadecane were the average values of contact angles measured at the following three points by the θ/2 method (θ/2=arctan(h/r), wherein θ: contact angle, r: radius of droplet, h: height of droplet) using a portable contact angle meter "PCA-1" (Kyowa Interface Science Co., Ltd.). The first measurement point selected was the central portion of the antifouling film of each example. The second and third measurement points were two points that are 20 mm or more apart from the first measurement point and are point-symmetrical to each other about the first measurement point.

<Rubbing Resistance>

The rubbing resistance was evaluated by the following method. First, the surface (the surface opposite to the substrate of the polymer layer) of the antifouling film of each example was rubbed with a tissue a few times. Then, the degree of whitening at the portion rubbed with the tissue was visually observed in a direction forming a small angle with the surface in an environment with an illuminance of 100 1× (under a fluorescent lamp). The evaluation criteria were as follows.

Good: No change occurred (no whitening was observed).
Fair: Slight whitening was observed.
Poor: Obvious whitening was observed.

The cases evaluated as good or fair were considered as within the allowable level (having excellent rubbing resistance).

<Adhesion>

The adhesion was evaluated by the following method. First, 11 vertical cuts and 11 horizontal cuts were made in a grid pattern with 1 mm spacing on the surface (the surface opposite to the substrate of the polymer layer) of the antifouling film of each example using a snap-off utility knife. Thereby, 100 squares (1 mm square) were formed. Then, polyester adhesive tape "No. 31B" from Nitto Denko Corp. was press-applied to the squares and peeled off in the 90° direction relative to the surface of the squares at a rate of 100 mm/s. The state of the polymer layer on the substrate after the peeling was visually observed, and the number of squares in which the polymer layer was not peeled off but left on the substrate was counted. The results are expressed by "X" (X represents the number of squares in which the polymer layer was not peeled off but left on the substrate).

contained in the antifouling agent is the largest in Example 3, so that the polymer layer 6 has a low crosslinking density and a low elasticity. When the surface (the surface opposite to the substrate 2) of the polymer layer 6 is rubbed with a tissue in this case, the projections 7 having fallen down are less likely to rise again (provides whitened appearance). Example 4 provided poorer adhesion than the other examples. This is presumably because the solvent component contained in the antifouling agent A in the resin A4 used in Example 4 remains in the interface between the substrate and the polymer layer, impairing the interaction between the substrate and the polymer layer at the interface. Accordingly, in consideration of the contact angles of water and of hexadecane (including aging thereof), Example 5 provided the best performance. The antifouling film 1 preferably includes a surface that shows a contact angle of 130° or greater with water and a contact angle of 30° or greater with hexadecane. The examination was also performed for the case of using a compound containing a perfluoro(poly)ether group with the active component content of 0.5 wt % in the resin. This examination showed the antifouling properties in this case were also excellent.

[Evaluation 2: Evaluation Based on Amount of Active Component of Antifouling Agent in Resin]

In consideration of the results of Evaluation 1, the antifouling properties of the antifouling agent used in Example 5 (Antifouling agent C) were evaluated while the amount of the active component of the antifouling agent in the resin was changed.

The materials used for producing the antifouling films were the same as in Example 5 except for the resin.

(Resin 3)

Resins A6 to A9 having the respective compositions shown in Table 3 were used. The abbreviations of the materials of the respective resins are as follows. Table 3 also indicates the amount of the active component of the antifouling agent in each resin.

<Antifouling Agent>
"Antifouling agent C"
<Monomer>
"UA": "UA-510H" (Kyoeisha Chemical Co., Ltd.)
"ATM": "ATM-35E" (Shin Nakamura Chemical Co., Ltd.)

TABLE 2

| | | | Example 1 | Example 2 | Example 3 | Example 4 | Example 5 | Comparative Example 1 | Comparative Example 2 |
|---|---|---|---|---|---|---|---|---|---|
| | Resin | | A1 | A2 | A3 | A4 | A5 | a1 | a2 |
| | Amount of active component of antifouling agent in resin (wt %) | | 1 | 2 | 5 | 5 | 5 | 0 | 5 |
| | Release agent | | A | A | A | A | A | A | A |
| Antifouling properties | Contact angle of water (°) | Immediately after dropping | 131 | 161 | 160 | 159 | 160 | 20 | 150 |
| | Contact angle of hexadecane (°) | Immediately after dropping | 32 | 71 | 81 | 86 | 86 | 9 | 28 |
| | | After 10 seconds | 16 | 31 | 75 | 75 | 80 | 7 | 11 |
| | Rubbing resistance | | Good | Good | Fair | Good | Good | Good | Good |
| | Adhesion | | 100 | 100 | 100 | 10 | 100 | 100 | 100 |

Table 2 demonstrates that Examples 1 to 5 provided better antifouling properties (especially oil repellency) than Comparative Examples 1 and 2. Example 3 provided slightly poor rubbing resistance than the other examples. This is because the amount of N-acryloylmorpholine ("ACMO")

"DPE": "Light Acrylate DPE-6A" (Kyoeisha Chemical Co., Ltd.)
"DM": "DMAA" (KJ Chemicals Corp.)
<Polymerization Initiator>
"819": "IRGACURE 819" (BASF SE)

TABLE 3

| Type | | Material name | Resin | | | |
| --- | --- | --- | --- | --- | --- | --- |
| | | | A6 | A7 | A8 | A9 |
| Composition (wt %) | Antifouling agent | C | 2.5 | 5 | 7.5 | 12.5 |
| | Monomer | UA | 8 | 8 | 8 | 8 |
| | | ATM | 45 | 44 | 43 | 41 |
| | | DPE | 19 | 19 | 19 | 19 |
| | | DM | 23.5 | 22 | 20.5 | 17.5 |
| | Polymerization initiator | 819 | 2 | 2 | 2 | 2 |
| Amount of active component of antifouling agent in resin (wt %) | | | 1 | 2 | 3 | 5 |

Examples 6 to 9

An antifouling film of each example was produced in the same manner as in Example 5, except that the composition was changed as shown in Table 4.
(Evaluation Contents and Evaluation Results)
For the antifouling films of Examples 6 to 9, the antifouling properties were evaluated. The results are shown in Table 4. For the antifouling properties, the water repellency (contact angle of water) and the oil repellency (contact angle of hexadecane) were evaluated in the same manner as in Evaluation 1.

TABLE 4

| | | | Example 6 | Example 7 | Example 8 | Example 9 |
| --- | --- | --- | --- | --- | --- | --- |
| Resin | | | A6 | A7 | A8 | A9 |
| Amount of active component of antifouling agent in resin (wt %) | | | 1 | 2 | 3 | 5 |
| Release agent | | | A | A | A | A |
| Antifouling properties | Contact angle of water (°) | Immediately after dropping | 158 | 164 | 162 | 164 |
| | Contact angle of hexadecane (°) | Immediately after dropping | 66 | 84 | 85 | 84 |
| | | After 10 seconds | 31 | 66 | 73 | 69 |

Table 4 demonstrates that as the amount of the active component of the antifouling agent in the resin is increased in the order of Example 6, Example 7, Example 8, and Example 9, the antifouling properties reached an equal or higher level.

Next, each of the antifouling films of Examples 6 to 9 was subjected to X-ray photoelectron spectroscopy (XPS) with the uneven structure being etched by a gas cluster ion beam (GCIB). The measurement device used was an X-ray photoelectron spectroscope (trade name: PHI 5000 VersaProbe II, Ulvac-Phi, Inc.) equipped with an argon gas cluster sputtering ion gun (trade name: 06-2000, the same company).

The measurement conditions for X-ray photoelectron spectroscopy were as follows.

X-ray beam diameter: 100 μm (25 W, 15 kV)

Analysis area: 1000 μm×500 μm

Photoelectron take-off angle: 45°

Pass energy: 46.95 eV

In the gas cluster ion beam, the sputtering conditions and the charge neutralization conditions were as follows.

<Sputtering Conditions>
Ion source: argon gas cluster ion beam
Accelerating voltage: 10 kV (15 mA Emission)
Sample current: 30 nA
Raster area: 4 mm×3 mm
Zalar rotation: not used
Sputtering time: 81 minutes (total of 1.5 min×2 cycles, 3 min×8 cycles, and 6 min×9 cycles)
Sputtering rate (etching rate): 27 nm/min (polyhydroxystyrene equivalent)
<Charge Neutralization Conditions>
Electron gun: Bias 1.0 V (20 μA Emission)
Ion gun: 3 V (7 mA Emission)

Figure 2:
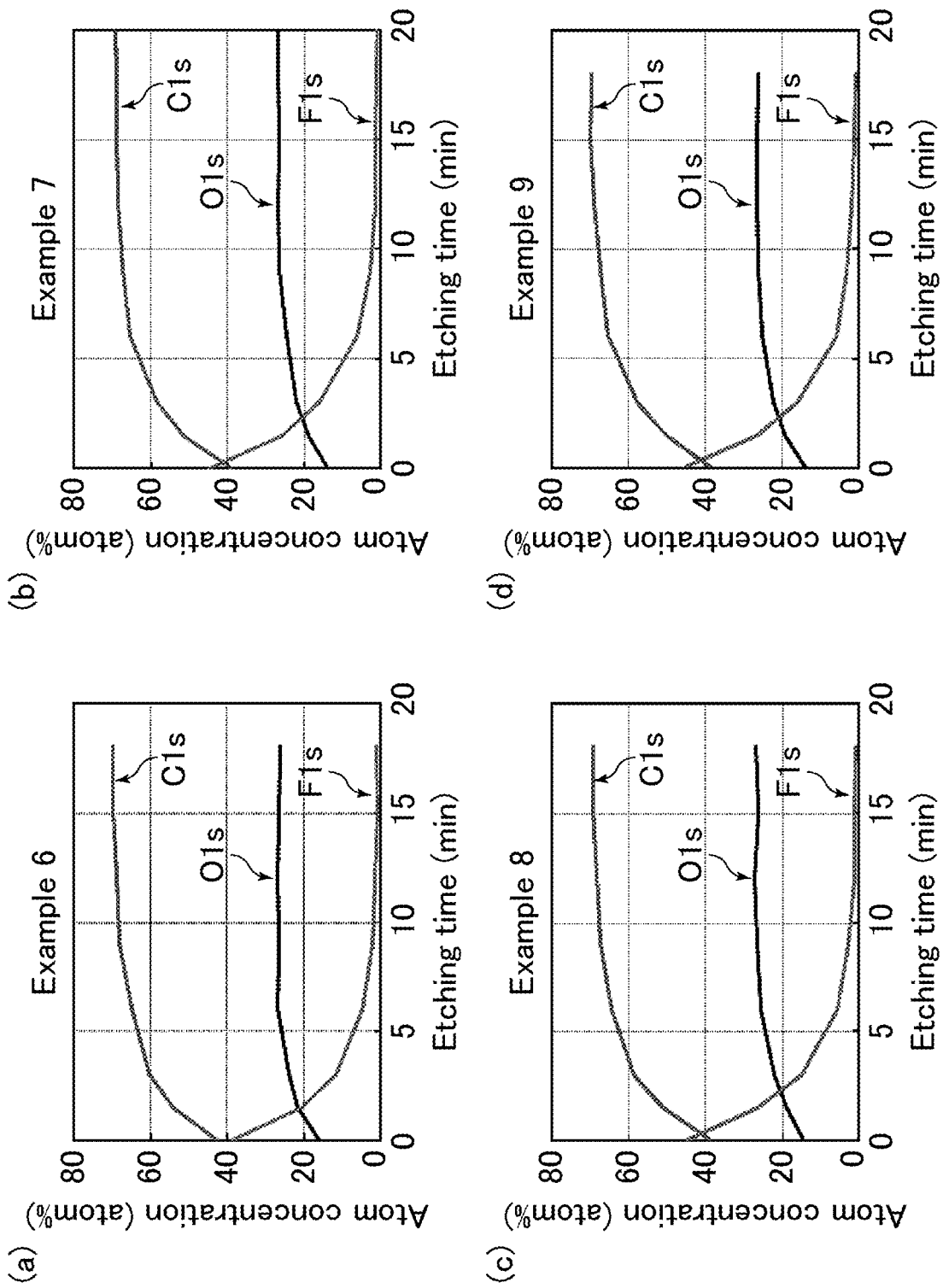
FIG. 2 includes graphs of the proportions of the number of carbon atoms, the number of oxygen atoms, and the number of fluorine atoms relative to the sum of the numbers of the atoms.

FIG. 2 includes graphs of the proportions of the number of carbon atoms, the number of oxygen atoms, and the number of fluorine atoms relative to the sum of the numbers of the atoms; FIG. 2(a) is a graph of Example 6, FIG. 2(b) is a graph of Example 7, FIG. 2(c) is a graph of Example 8, and FIG. 2(d) is a graph of Example 9. FIG. 2 shows that the fluorine atoms are distributed at a high concentration in a very superficial layer in the antifouling films of Examples 6 to 9. Specifically, the concentration of the fluorine atoms in the surface of the antifouling film (etching time: 0 min) was 38.6 atom % in Example 6, 45.1 atom % in Example 7, 45.0 atom % in Example 8, and 45.6 atom % in Example 9. The concentration of the fluorine atoms in the surface of the antifouling film is preferably 38 atom % or higher, more preferably 45 atom % or higher.

[Evaluation 3: Evaluation Based on Type of Release Agent]
The antifouling films were evaluated while the type of the release agent was changed.
The materials used for producing the antifouling films were the same as Example 5 except for the release agent.
(Release agent 5)
The following four compounds were used as the release agents. The abbreviations of the respective release agents are as follows.
(1) "Release Agent A"
  "Optool DSX" (Daikin Industries, Ltd.)
(2) "Release Agent B"
  "Optool UD100" (Daikin Industries, Ltd.)
(3) "Release Agent C"
  Mixture of "Optool DSX" (Daikin Industries, Ltd.) and $C_6F_{13}CH_2CH_2Si(OMe)_3$ (weight ratio 1:1)
(4) "Release Agent D"
  $C_6F_{13}CH_2CH_2Si(OMe)_3$ Examples 10 to 12 and Comparative Example 3

An antifouling film of each example was produced in the same manner as in Example 5, except that the composition was changed as shown in Table 5.

(Evaluation Contents and Evaluation Results)

For the antifouling films of Examples 10 to 12 and Comparative Example 3, the antifouling properties were evaluated. The results are shown in Table 5. For the antifouling properties, the water repellency (contact angle of water) was evaluated in the same manner as in Evaluation 1.

TABLE 5

| | | | Example 10 | Example 11 | Example 12 | Comparative Example 3 |
|---|---|---|---|---|---|---|
| Resin | | | A5 | A5 | A5 | A5 |
| Amount of active component of antifouling agent in resin (wt %) | | | 5 | 5 | 5 | 5 |
| Release agent | | | A | B | C | D |
| Antifouling properties | Contact angle of water (°) | Immediately after dropping | 132.6 | 126.6 | 144.5 | 24.2 |

Table 5 demonstrates that Examples 10 to 12 provided a greater contact angle of water, i.e., provided better antifouling properties than Comparative Example 3. Therefore, for those containing an antifouling agent that contains a perfluoropolyether compound as a resin, the presence of a perfluoropolyether compound as a release agent, as in Examples 10 to 12, enables improved antifouling properties.

ADDITIONAL REMARKS

An aspect of the present invention may be a method for producing an antifouling film including a polymer layer that includes on a surface thereof an uneven structure provided with multiple projections at a pitch not longer than a wavelength of visible light, the method including: Process (1) of applying a resin to a surface of a substrate; Process (2) of pushing the substrate to a die with the resin in between to form the uneven structure on a surface of the resin; and Process (3) of curing the resin including the uneven structure on the surface thereof to form the polymer layer, the resin containing an antifouling agent that contains a compound containing a perfluoro(poly)ether group, the die including a surface having undergone release treatment using a release agent containing a compound that contains a perfluoro(poly)ether group, a hydrolyzable group, and a Si atom. This aspect enables production of an antifouling film having excellent antifouling properties and rubbing resistance.

The antifouling agent may contain a carbon-carbon double bond-containing compound that is a reaction product of a component (A) and a component (B), the component (A) being a polyisocyanate that is a trimer of a diisocyanate and the component (B) being an active-hydrogen-containing compound. The component (B) may contain a component (B1) and a component (B2), the component (B1) being an active-hydrogen-containing perfluoropolyether and the component (B2) being a monomer containing a carbon-carbon double bond-containing group and active hydrogen. The component (B1) may be at least one compound represented by one of the following formulas (B1-i) and (B1-ii). This embodiment allows the antifouling agent to be effectively used.

$$Rf\text{-}PFPE^1\text{-}Z\text{-}X \quad (B1\text{-}i)$$

$$X\text{-}Z\text{-}PFPE^2\text{-}Z\text{-}X \quad (B1\text{-}ii)$$

In the formulas (B1-i) and (B1-ii), Rf is a C1-C16 alkyl group optionally substituted with one or more fluorine atoms;

$PFPE^1$ is a group represented by the following formula (D1), (D2), or (D3):

$$-(OCF_2CF_2CF_2)_b- \quad (D1)$$

wherein b is an integer of 1 to 200;

$$-(OCF_2CF_2CF_2CF_2)_a-(OCF_2CF_2CF_2)_b-(OCF_2CF_2)_c-(OCF_2)_d- \quad (D2)$$

wherein a and b are each individually an integer of 0 to 30; c and d are each individually an integer of 1 to 200; and the repeating units parenthesized with a, b, c, or d are present in any order in the formula (D2); and $$-(OC_2F_4-R^5)_i- \quad (D3)$$

wherein $R^5$ is $OC_2F_4$, $OC_3F_6$, or $OC_4F_8$; and i is an integer of 2 to 100;

$PFPE^2$ is a group represented by the following formula (D4) or (D5):

$$-(OCF_2CF_2CF_2)_b- \quad (D4)$$

wherein b is an integer of 1 to 200; and $$-(OC_2F_4-R^5)_i- \quad (D5)$$

wherein $R^5$ is $OC_2F_4$, $OC_3F_6$, or $OC_4F_8$; and i is an integer of 2 to 100;

Zs are each individually a divalent organic group; and

X is an active-hydrogen-containing group.

The release agent may contain at least one compound selected from the group consisting of compounds represented by the following formulas (1a), (1b), (2a), (2b), (3a), and (3b). This embodiment allows the release agent to be effectively used.

[Chem. 13]

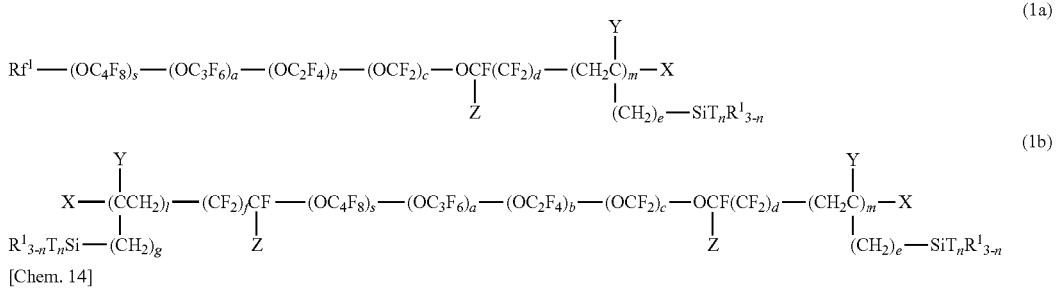

[Chem. 14]

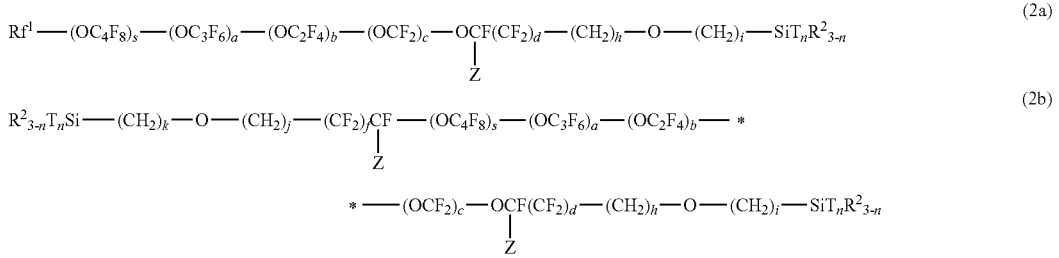

In the formulas (1a), (1b), (2a), and (2b), $Rf^1$ and $Rf^2$ are each a C1-C16 alkyl group optionally substituted with one or more fluorine atoms; a, b, c, and s are each individually an integer of 0 to 200, and the sum of them is 1 or greater; the repeating units parenthesized with a, b, c, or s are present in any order in the formulas (1a), (1b), (2a), and (2b); d and f are each 0 or 1; e and g are each an integer of 0 to 2; h and j are each 1 or 2; i and k are each an integer of 2 to 20; X is a hydrogen atom or a halogen atom; Y is a hydrogen atom or a lower alkyl group; Z is a fluorine atom or a lower fluoroalkyl group; $R^1$ and $R^2$ are each a C1-C22 alkyl group, a C1-C22 alkoxy group, or a hydroxy group; T is a hydroxy group or a hydrolyzable group; n is an integer of 1 to 3; and m and l are each an integer of 1 to 10.

$$A\text{-}Rf\text{---}X\text{-}SiQ_kY_{3-k} \quad (3a)$$

$$Y_{3-k}Q_kSi\text{---}X\text{---}Rf\text{---}X\text{-}SiQ_kY_{3-k} \quad (3b)$$

In the formulas (3a) and (3b), A is a C1-C16 alkyl group optionally substituted with one or more fluorine atoms; Rf is a group represented by the following formula (E1):

$$\text{---}(OC_4F_8)_a\text{---}(OC_3F_6)_b\text{---}(OC_2F_4)_c\text{---}(OCF_2)_d\text{---} \quad (E1)$$

wherein a, b, c, and d are each individually an integer of 0 or greater, and the sum of them is 1 or greater; and the repeating units parenthesized with a, b, c, or d are present in any order in the formula (E1);

X is a divalent organic group; Y is a hydroxy group, a hydrolyzable group, or a hydrocarbon group; Q is a group represented by the following formula (E2):

$$\text{---}Z\text{---}SiR^1{}_nR^2{}_{3-n} \quad (E2)$$

wherein Zs are each individually a divalent organic group; $R^1$s are each individually a hydroxy group or a hydrolyzable group; $R^2$s are each individually a C1-C22 alkyl group or Q'; Q' is defined in the same manner as Q; and each n in Q and Q' is individually an integer of 0 to 3, and the sum of them is 1 or greater; and k is an integer of 1 to 3.

The resin may contain 0.1 wt % or more and 10 wt % or less of an active component of the antifouling agent. This embodiment can sufficiently improve the antifouling properties and rubbing resistance of the antifouling film.

The resin may be curable by ultraviolet rays. This embodiment allows the resin to be effectively used.

The antifouling film may include a surface that shows a contact angle of 130° or greater with water and a contact angle of 30° or greater with hexadecane. This embodiment can sufficiently improve the antifouling properties of the antifouling film.

The antifouling film may include a surface that has a fluorine atom concentration of 38 atom % or higher. This embodiment can sufficiently improve the antifouling properties of the antifouling film.

The polymer layer may have a thickness of 1 μm or greater and 20 μm or smaller. This embodiment can prevent easy sighting of defects (e.g., deformation transferred from the die, foreign substances) in the antifouling film. This embodiment can also prevent occurrence of defects such as curling of the antifouling film due to curing and shrinkage of the resin.

The pitch may be 20 nm or greater and 400 nm or smaller. This embodiment can prevent reduction in rubbing resistance of the antifouling film and can prevent occurrence of undesirable appearance of the antifouling film.

Each of the projections may have a height of 50 nm or greater and 500 nm or smaller. This embodiment can prevent insufficient antireflective performance of the antifouling film. This embodiment can also prevent insufficient mechanical strength of the projections and thus can prevent reduction in rubbing resistance of the antifouling film.

Each of the projections may have an aspect ratio of 0.13 or greater and 25 or smaller. This embodiment enables both mechanical strength (rubbing resistance) and optical performance (antireflective performance, performance of preventing unnecessary phenomena such as diffraction and scattering) of the antifouling film at high levels.

REFERENCE SIGNS LIST

1: antifouling film
2: substrate

3: resin
4: die
5: release agent
6: polymer layer
7: projection
P: pitch
Q: thickness of polymer layer

The invention claimed is:

1. A method for producing an antifouling film including a polymer layer that includes on a surface thereof an uneven structure provided with multiple projections at a pitch not longer than a wavelength of visible light, the method comprising:

Process (1) of applying a resin to a surface of a substrate;
Process (2) of pushing the substrate to a die with the resin in between to form the uneven structure on a surface of the resin; and
Process (3) of curing the resin including the uneven structure on the surface thereof to form the polymer layer,
the resin containing an antifouling agent that contains a compound containing a perfluoro(poly)ether group, and a compatibilizer that is compatible with the antifouling agent,
the compatibilizer being a monofunctional monomer containing an amide group,
the resin containing 20 to 40 wt % of the compatibilizer, and
the die including a surface having undergone release treatment using a release agent containing a compound that contains a perfluoro(poly)ether group, a hydrolyzable group, and a Si atom.

2. The method for producing an antifouling film according to claim 1,
wherein the antifouling agent contains a carbon-carbon double bond-containing compound that is a reaction product of a component (A) and a component (B), the component (A) being a polyisocyanate that is a trimer of a diisocyanate and the component (B) being an active-hydrogen-containing compound,
the component (B) contains a component (B1) and a component (B2), the component (B1) being an active-hydrogen-containing perfluoropolyether and the component (B2) being a monomer containing a carbon-carbon double bond-containing group and active hydrogen,
the component (B1) is at least one compound represented by one of the following formulas (B1-i) and (B1-ii):

(B1-i)

(B1-ii)

wherein
Rf is a C1-C16 alkyl group optionally substituted with one or more fluorine atoms;
$PFPE^1$ is a group represented by the following formula (D1), (D2), or (D3):

 (D1)

wherein b is an integer of 1 to 200;

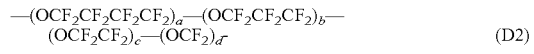 (D2)

wherein a and b are each individually an integer of 0 to 30; c and d are each individually an integer of 1 to 200; and the repeating units parenthesized with a, b, c, or d are present in any order in the formula (D2); and $—(OC_2F_4—R^5)_i—$ (D3)

wherein $R^5$ is $OC_2F_4$, $OC_3F_6$, or $OC_4F_8$; and i is an integer of 2 to 100;

$PFPE^2$ is a group represented by the following formula (D4) or (D5):

 (D4)

wherein b is an integer of 1 to 200; and

 (D5)

wherein $R^5$ is $OC_2F_4$, $OC_3F_6$, or $OC_4F_8$; and i is an integer of 2 to 100;

Zs are each individually a divalent organic group; and
X is an active-hydrogen-containing group.

3. The method for producing an antifouling film according to claim 1,
wherein the resin contains 0.1 wt % or more and 10 wt % or less of an active component of the antifouling agent.

4. The method for producing an antifouling film according to claim 1,
wherein the resin is curable by ultraviolet rays.

5. The method for producing an antifouling film according to claim 1,
wherein the antifouling film includes a surface that shows a contact angle of 130° or greater with water and a contact angle of 30° or greater with hexadecane.

6. The method for producing an antifouling film according to claim 1,
wherein the antifouling film includes a surface that has a fluorine atom concentration of 38 atom % or higher.

7. The method for producing an antifouling film according to claim 1,
wherein the polymer layer has a thickness of 1 μm or greater and 20 μm or smaller.

8. The method for producing an antifouling film according to claim 1,
wherein the pitch is 20 nm or greater and 400 nm or smaller.

9. The method for producing an antifouling film according to claim 1,
wherein each of the projections has a height of 50 nm or greater and 500 nm or smaller.

10. The method for producing an antifouling film according to claim 1,
wherein each of the projections has an aspect ratio of 0.13 or greater and 25 or smaller.

* * * * *